US011303832B2

(12) United States Patent
Yorikado

(10) Patent No.: US 11,303,832 B2
(45) Date of Patent: Apr. 12, 2022

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Yuhi Yorikado, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/274,722

(22) PCT Filed: Sep. 11, 2019

(86) PCT No.: PCT/JP2019/035626
§ 371 (c)(1),
(2) Date: Mar. 9, 2021

(87) PCT Pub. No.: WO2020/059580
PCT Pub. Date: Mar. 26, 2020

(65) Prior Publication Data
US 2021/0352232 A1 Nov. 11, 2021

(30) Foreign Application Priority Data
Sep. 19, 2018 (JP) .............................. JP2018-175243

(51) Int. Cl.
*H04N 5/3745* (2011.01)
*H04N 5/374* (2011.01)
(Continued)

(52) U.S. Cl.
CPC ....... *H04N 5/363* (2013.01); *H01L 27/14614* (2013.01); *H04N 5/378* (2013.01); *H04N 5/3742* (2013.01); *H04N 5/37457* (2013.01)

(58) Field of Classification Search
None
See application file for complete search history.

(56) References Cited

U.S. PATENT DOCUMENTS 10,002,894 B2* 6/2018 Yamashita ........ H01L 27/14605
2008/0258047 A1 10/2008 Sakakibara et al.
2019/0289240 A1 9/2019 Zhu et al.

FOREIGN PATENT DOCUMENTS

CN 101296330 A 10/2008
CN 109845243 A 6/2019
(Continued)

OTHER PUBLICATIONS

International Search Report and Written Opinion of PCT Application No. PCT/JP2019/035626, dated Dec. 10, 2019, 10 pages of ISRWO.

*Primary Examiner* — Mark T Monk
(74) *Attorney, Agent, or Firm* — Chip Law Group

(57) ABSTRACT

To suppress deterioration of image quality. A solid-state imaging device (1) according to an embodiment includes a plurality of unit pixels (100) each of which includes a photoelectric conversion element (PD) configured to generate an electric charge corresponding to an incident light quantity, a transfer transistor (102) configured to transfer the electric charge generated in the photoelectric conversion element, a charge accumulation unit (FD) configured to accumulate the electric charge transferred by the transfer transistor, an amplification transistor ($105_1$, $105_2$) including at least two fingers that are connected to the charge accumulation unit in parallel, and a selection transistor (106) that is disposed corresponding to each of the fingers of the amplification transistor on a one-to-one basis.

16 Claims, 21 Drawing Sheets

(51) Int. Cl.
*H01L 27/146* (2006.01)
*H04N 5/363* (2011.01)
*H04N 5/378* (2011.01)

(56) References Cited

FOREIGN PATENT DOCUMENTS

| | | |
|---|---|---|
| JP | 2008-22259 A | 1/2008 |
| JP | 2008-271280 A | 11/2008 |
| JP | 2018-74268 A | 5/2018 |
| KR | 10-2008-0095175 A | 10/2008 |

* cited by examiner

SOLID-STATE IMAGING DEVICE AND ELECTRONIC APPARATUS

CROSS REFERENCE TO RELATED APPLICATIONS

This application is a U.S. National Phase of International Patent Application No. PCT/JP2019/035626 filed on Sep. 11, 2019, which claims priority benefit of Japanese Patent Application No. JP 2018-175243 filed in the Japan Patent Office on Sep. 19, 2018. Each of the above-referenced applications is hereby incorporated herein by reference in its entirety.

FIELD

The present disclosure relates to a solid-state imaging device and an electronic apparatus.

BACKGROUND

In a complementary metal oxide semiconductor (CMOS) type of solid-state imaging device (hereinafter, referred to as a CMOS image sensor, or simply referred to as an image sensor), a signal charge generated in a photoelectron conversion unit (light receiving unit) is converted into a voltage in a floating diffusion region (floating diffusion: FD). The voltage converted in the FD is read out as an output voltage (also referred to as a pixel signal) via a source follower circuit constituted of an amplification transistor.

Assuming that signal detection capacitance is C and a signal charge amount corresponding to a light receiving signal is Q, an output voltage V of a pixel is given by V=Q/C. Thus, if the signal detection capacitance C is small, the output voltage V can be increased, that is, sensitivity can be raised.

Thus, in the related art, a high-sensitivity signal output has been implemented by configuring a pixel with a photoelectric conversion element the one end of which is grounded, a source-grounding type amplification transistor in which a gate electrode is connected to the other end of the photoelectric conversion element, a source electrode is grounded, and a drain electrode is connected to a load circuit, a capacitive element connected between the drain electrode and the gate electrode of the amplification transistor, and a reset transistor connected to the capacitive element in parallel, and reducing capacitance of the capacitive element.

CITATION LIST

Patent Literature

Patent Literature 1: Japanese Patent Application Laid-open No. 2008-271280

SUMMARY

Technical Problem

However, as pixels have been further micronized in recent years, it has become more difficult to obtain a signal voltage having a sufficient voltage value from individual pixels. When the output voltage is small, a ratio of noise components occupying the output voltage is increased, and as a result, a problem is caused such that image quality is deteriorated because an output image is affected by a noise.

Thus, the present disclosure provides a solid-state imaging device and an electronic apparatus that can suppress deterioration of the image quality.

Solution to Problem

To solve the above-described problem, a solid-state imaging device according to one aspect of the present disclosure comprises a plurality of unit pixels, each of the unit pixels comprising: a photoelectric conversion element configured to generate an electric charge corresponding to an incident light quantity; a transfer transistor configured to transfer the electric charge generated in the photoelectric conversion element; a charge accumulation unit configured to accumulate the electric charge transferred by the transfer transistor; an amplification transistor including at least two fingers that are connected to the charge accumulation unit in parallel; and a selection transistor that is disposed corresponding to each of the fingers of the amplification transistor on a one-to-one basis.

DESCRIPTION OF EMBODIMENTS

Figure 1:
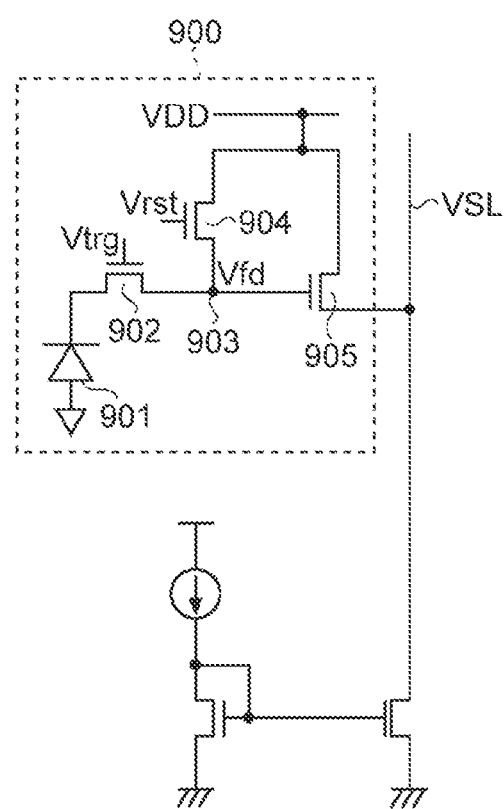
FIG. 1 is a circuit diagram illustrating a schematic configuration example of a CMOS image sensor.

The following describes embodiments of the present disclosure in detail based on the drawings. In the following embodiments, the same part is denoted by the same reference numeral, and redundant description will not be repeated.

The present disclosure will be explained in order of items described below.
1. Introduction
2. First Embodiment
2.1 System configuration example of CMOS image sensor
2.2 Circuit configuration example of unit pixel
2.3 Basic function example of unit pixel
2.4 Layout example of unit pixel
2.5 Example of differential amplification read-out circuit
2.6 Driving example of differential amplification read-out circuit
  2.6.1 First differential read-out mode (high conversion efficiency)
  2.6.2 Second differential read-out mode (low conversion efficiency)
2.7 Switching between differential amplification read-out circuit and source follower read-out circuit
  2.7.1 First connection state (source follower read-out circuit)
  2.7.2 Second connection state (source follower read-out circuit)
  2.7.3 Third connection state (differential amplification read-out circuit)
  2.7.4 Fourth connection state (differential amplification read-out circuit)
2.8 Function and effect
3. Second Embodiment
3.1 Layout example of unit pixel
3.2 Switching between differential amplification read-out circuit and source follower read-out circuit
3.3 Function and effect
4. Third Embodiment
4.1 Layout example of unit pixel
4.2 Function and effect 1. Introduction In a typical CMOS image sensor, as illustrated in FIG. 1, a unit pixel 900 is configured by using a photodiode (hereinafter, referred to as a PD) 901 as a photoelectric conversion element, a floating diffusion region (floating diffusion, referred to as FD hereinafter) 903 that converts an electron generated in the PD 901 into a voltage, and an amplification transistor 905 using a voltage of the FD 903 as a gate input. The FD is also called a charge accumulation unit.

An analog output voltage (pixel signal) is read out from each unit pixel 900 via a source follower circuit constituted of the amplification transistor 905 (hereinafter, referred to as a source follower read-out circuit), and converted (Analog to Digital (AD)-converted) into a digital voltage value.

On the other hand, as a configuration of reading out the pixel signal from the unit pixel 900, there is a configuration in which a differential-type amplifier circuit (hereinafter, simply referred to as a differential amplifier circuit) is constituted of two unit pixels 900 to read out the pixel signal via the differential amplifier circuit (hereinafter, referred to as a differential amplification read-out circuit) in addition to the source follower read-out configuration.

The electron generated in the PD 901 is converted into a voltage at voltage conversion efficiency ($\mu V/e^-$) per electron corresponding to parasitic capacitance of a node constituting the FD 903. A voltage amplitude $\Delta V_{fd}$ of the FD 903 corresponding to the number of signal electrons is read out from each unit pixel 900 via the amplification transistor 905. At this point, a noise is superimposed on the read-out pixel signal.

Examples of main generation sources of the noise include a pixel noise (also referred to as a random noise) Vn_pix ($\mu V$ (microvolt) rms) generated by the amplification transistor 905 in the unit pixel 900, an AFE noise Vn_afe ($\mu Vrms$) generated by an analog circuit (Analog Front End: AFE) such as a circuit that amplifies a voltage that is read out from each unit pixel 900 via a vertical signal line VSL, and an ADC noise Vn_adc ($\mu Vrms$) generated by an AD conversion circuit (ADC).

Figure 2:
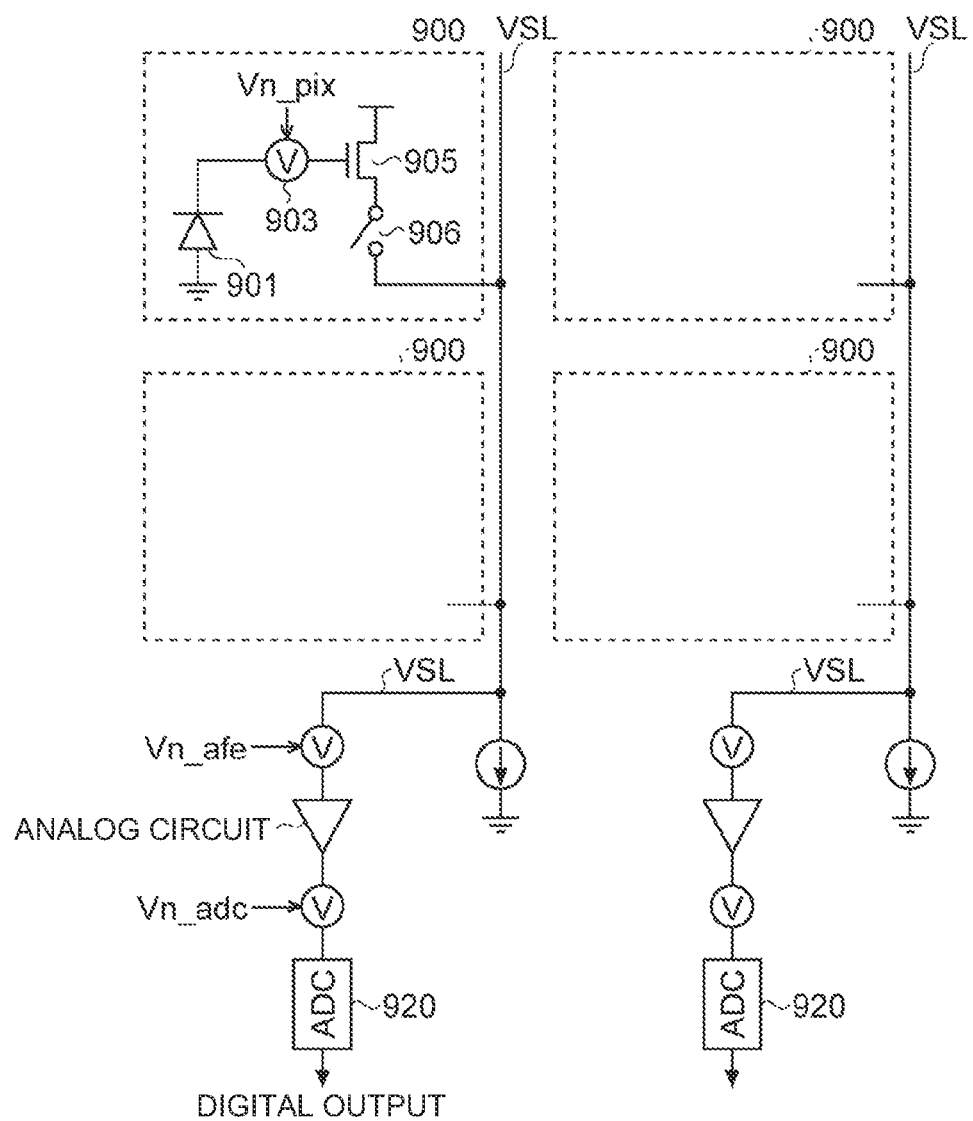
FIG. 2 is a diagram for explaining noises generated in the CMOS image sensor.

In the following description, as illustrated in FIG. 2, a noise input-converted into a voltage noise generated in the FD 903 is defined as the pixel noise Vn_pix, a noise converted into a voltage noise generated in the vertical signal line VSL is defined as the AFE noise Vn_afe, and a noise converted into a noise generated at an input node of an ADC 920 is defined as the ADC noise Vn_adc.

In the source follower read-out circuit, gain $A_{sf}$ of a voltage amplitude $\Delta V_{vsl}$ of the vertical signal line VSL with respect to a voltage amplitude $\Delta V_{fd}$ of the FD 903 is obtained by $\Delta V_{vsl} = A_{sf} \times \Delta V_{fd}$, and a value thereof is about 0.8 to 1.0 times. In a case in which conversion efficiency ($\mu V/e^-$) of electron-voltage conversion in the FD 903 is assumed to be $\eta_{fd}$, that is, in a case in which conversion efficiency ($\mu V/e^-$) of electron-voltage conversion in the vertical signal line VSL is assumed to be $\eta_{vsl}$, $\eta_{vsl} = A_{sf} \times \eta_{fd}$ is satisfied.

In this case, assuming that the number of electrons of a signal read out from the PD 901 (also referred to as a signal electron number) is Nsig_e, $\Delta V_{vsl} = \eta_{vsl} \times N_{sig\_e} = \eta_{fd} \times A_{sf} \times$ Nsig_e can be established. For simplicity, assuming that the voltage is not amplified by the AFE, that is, the gain is 1 time, when a noise superimposed on an output of the ADC 920 is converted into a voltage noise generated in the vertical signal line VSL as Vn_total (μVrms), a total noise Vn_total is the sum of the ADC noise Vn_adc, the AFE noise Vn_afe, and a noise $A_{fd} \times$ Vn_pix (square-arithmetic mean). This represents that the total noise Vn_total is superimposed on the voltage amplitude $\Delta V_{vsl}$ of the vertical signal line VSL based on the signal electron number Nsig_e. $A_{fd}$ is gain of the FD 903.

From the viewpoint of image quality, what amount of noise is superimposed on a certain signal electron number Nsig_e is important. When the total noise Vn_total is converted into the number of electrons in the FD 903 (unit: e⁻rms), the number of electrons Vn_total_e of the total noise Vn_total is represented by the following expression (1).

$$\text{Vn\_total\_e} = \sqrt{(\text{Vn\_adc}/\eta_{vsl})^2 + (\text{Vn\_afe}/\eta_{vsl})^2 + (\text{Vn\_pix}/\eta_{fd})^2} \quad (1)$$

In the expression (1), $\eta_{vsl} = A_{sf} \times \eta_{fd}$ is established, so that it can be found that influence of the ADC noise Vn_adc and the AFE noise Vn_afe can be reduced by increasing the gain $A_{sf}$, and influence of the ADC noise Vn_adc, the AFE noise Vn_afe, and the pixel noise Vn_pix can be reduced by increasing the conversion efficiency $\eta_{fd}$.

As described above, the gain $A_{sf}$ is voltage gain of the source follower circuit, typically 0.8 to 1.0, and theoretically equal to or smaller than 1.0. Thus, it is difficult to improve the gain $A_{sf}$. On the other hand, the conversion efficiency $\eta_{fd}$ is determined based on the sum total $C_{fd}$ of parasitic capacitance viewed from the FD 903, and $\eta_{fd} = e/C_{fd}$ is established. e represents a quantum of electrons, and is a constant of $1.602 \times 10^{-19}$ coulomb.

Figure 3A:
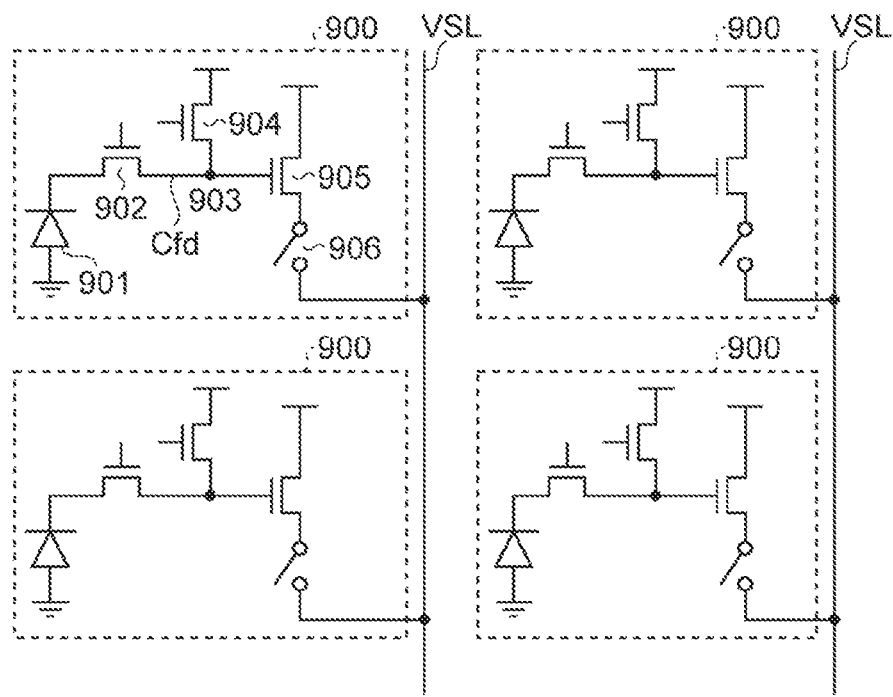
FIG. 3A is a diagram illustrating an arrangement example of unit pixels in the CMOS image sensor.
Figure 3B:
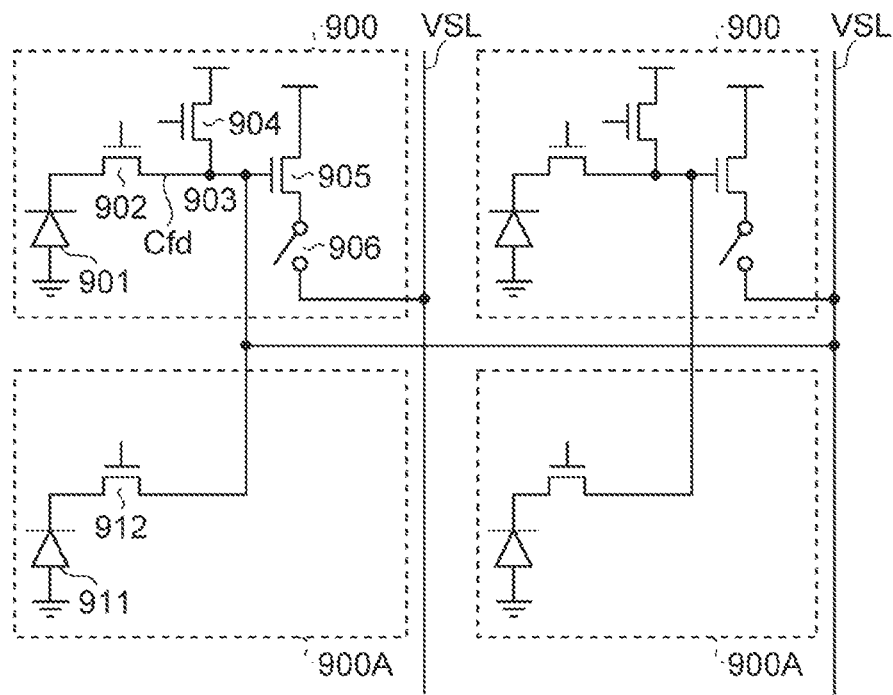
FIG. 3B is a diagram illustrating a configuration example in a case in which a plurality of unit pixels share a transistor in the CMOS image sensor.

There is a physical limit to capacitance reduction for reducing noises. As illustrated in FIGS. 3A and 3B, in a case of employing a structure in which a plurality of the unit pixels 900 share a transistor (for example, a reset transistor 904 or an amplification transistor 905, also referred to as a pixel transistor hereinafter) to reduce a pitch of the unit pixels 900 (hereinafter, referred to as a pixel pitch), the parasitic capacitance Cfd of the FD 903 is increased along with extension of wiring from a plurality of transfer transistors 902 of sharing pixels 900A to the amplification transistor 905, and it becomes more difficult to increase the conversion efficiency ηfd.

As described above, the gain $A_{sf}$ is about 1 time in the source follower read-out circuit, so that, when the conversion efficiency $\eta_{fd}$ cannot be increased because the unit pixel 900 is micronized, there is the problem that the conversion efficiency $\eta_{vsl}$ cannot be designed to be large, and the noises cannot be reduced.

On the other hand, in the differential amplification read-out circuit, gain $A_{dif}$ of the voltage amplitude $\Delta V_{vsl}$ of the vertical signal line VSL is determined based on parasitic capacitance $C_{gd}$ with respect to the vertical signal line VSL as part of the overlap capacitance $C_{fd}$ of the FD 903. The overlap capacitance $C_{gd}$ may include not only the parasitic capacitance of the amplification transistor 905 but also capacitance that is intentionally added by wiring capacitance and the like to adjust the gain $A_{dif}$.

In a case in which open loop gain of the differential amplifier circuit in the differential amplification read-out circuit is assumed to be $-Av$, $\eta_{vsl} = e/\{C_{gd} + C_{fd}/-Av\}$ is established. Similarly, when a total noise in the differential amplification read-out circuit is converted into the number of electrons in the FD 903, the number of electrons Vn_total_e of the total noise Vn_total is represented by the following expression (2).

$$\text{Vn\_total\_e} = \sqrt{(\text{Vn\_adc}/\eta_{vsl})^2 + (\text{Vn\_afe}/\eta_{vsl})^2 + (\text{Vn\_pix}/\eta_{fd})^2} \quad (2)$$

As is clear from the expression (2), the noise can be reduced by increasing the conversion efficiency $\eta_{vsl}$ and $\eta_{fd}$ also in the differential amplification read-out circuit.

Based on a comparison between the expression (1) of the source follower read-out circuit and the expression (2) of the differential amplification read-out circuit, regarding the ADC noise Vn_adc and the AFE noise Vn_afe, the conversion efficiency $\eta_{vsl}$ in the expression (1) is $A_{sf} \times \eta_{fd}$ and the gain $A_{sf}$ is 1.0 at the maximum, so that $\eta_{vsl} \leq \eta_{fd} = e/C_{fd}$ is established. Thus, the conversion efficiency $\eta_{vsl}$ cannot be increased in a situation in which the parasitic capacitance $C_{fd}$ is difficult to be reduced.

On the other hand, the conversion efficiency $\eta_{vsl}$ of the expression (2) can be represented by the following expression (3). In the expression (3), $C_{fd-vsl}$ represents inter-wiring capacitance between the FD 903 and the vertical signal line VSL.

$$\eta_{vsl} = \frac{e}{\dfrac{C_{fd}}{-Av} + (C_{gd} + C_{fd-vsl})} \quad (3)$$

In the expression (3), the open loop gain $-Av$ is typically a large value, that is, about several tens to hundreds. Thus, the parasitic capacitance $C_{fd}$ of the FD 903 having a large capacitance value is suppressed by the high open loop gain $-Av$. Due to this, influence of the parasitic capacitance $C_{fd}$ can be suppressed, and as a result, $\eta_{vsl} \approx e/C_{gd}$ can be established.

Figure 4:
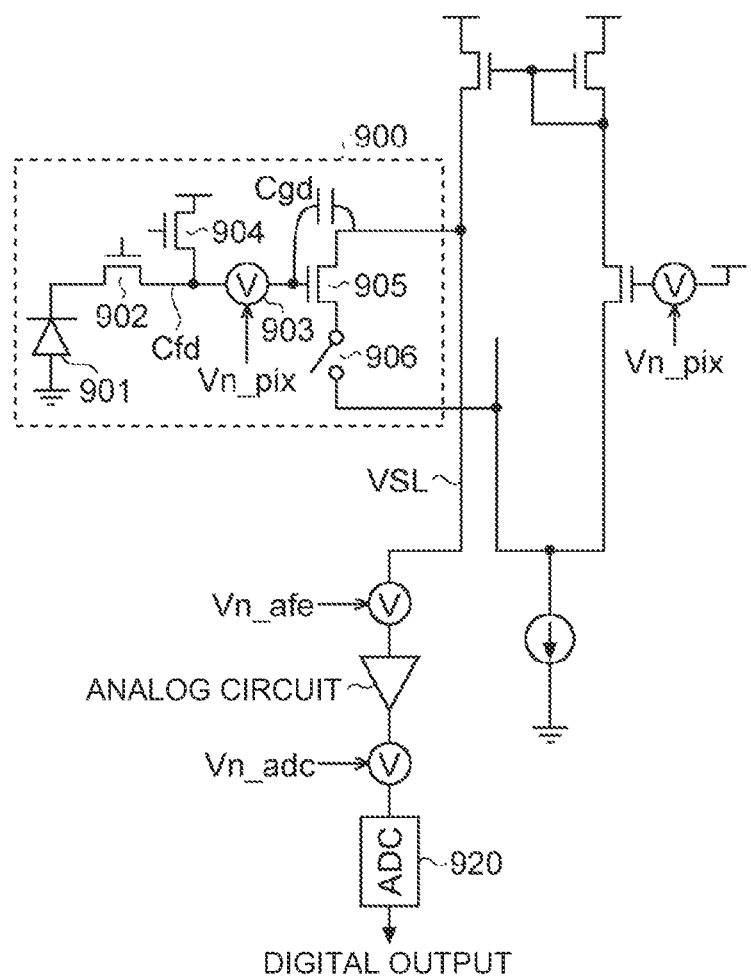
FIG. 4 is a diagram for explaining capacitance parasitic to an amplification transistor of the CMOS image sensor.

The overlap capacitance $C_{gd}$ is part of the parasitic capacitance $C_{fd}$, so that the parasitic capacitance $C_{gd}$ is a smaller value than the parasitic capacitance $C_{fd}$. Additionally, as illustrated in FIG. 4, the overlap capacitance $C_{gd}$ is capacitance parasitic to the amplification transistor 905, so that even in a case of employing a structure in which the unit pixels 900 share the amplification transistor 905 (refer to FIG. 3B), the capacitance is not prevented from being reduced. That is, the conversion efficiency $\eta_{vsl}$ can be a larger value in the differential amplification read-out circuit. This indicates that the differential amplification read-out circuit has an advantage over the source follower read-out circuit from the viewpoint of noise reduction.

However, the differential amplification read-out circuit has higher conversion efficiency than that of the source follower read-out circuit, but has a maximum number of input electrons that can be read out smaller than that of the source follower read-out circuit. That is, a dynamic range at the time of differential amplification read-out is small. Thus, practically, it is preferable to switch between source follower read-out and differential amplification read-out in accordance with an imaging illuminance condition and the like by an auto exposure (AE) control system of an imaging device equipped with a solid-state imaging element. However, if an output signal level, a total noise, and the like of a taken image at the time of switching are largely changed, a degree of brightness or a noise of an output image varies. Accordingly, it becomes difficult to reduce deterioration of image quality in a case of incorporating a configuration for switching between source follower read-out and differential-type amplification read-out into the AE control system.

Thus, for example, it is possible to lower the conversion efficiency and widen the dynamic range by intentionally adding capacitance (corresponding to $C_{gd}$) between the FD 903 and the vertical signal line VSL to be closer to a characteristic of source follower read-out, but suppression rates of the AFE noise Vn_afe and the ADC noise Vn_adc are lowered as the conversion efficiency is lowered. Additionally, the pixel noise Vn_pix is inversely proportional to the total capacitance of the FD 903, so that the total noise Vn_total is deteriorated. As a result, a problem is caused such that an advantage of the differential amplification read-out circuit, that is, low-noise read-out in a sufficiently dark scene, is reduced.

Additionally, if the conversion efficiency $\eta_{vsl}$ of the differential amplification read-out circuit becomes too high, influence of variations in the parasitic capacitance Cfd in the denominator of the expression (3) described above is increased, and a problem is caused such that a Photo Response Non-Uniformity (PRNU) characteristic is deteriorated and image quality is deteriorated, accordingly.

Thus, in the following embodiment, the conversion efficiency at the time of differential amplification read-out can be adjusted. Due to this, the conversion efficiency at the time of differential amplification read-out can be adjusted depending on a situation, so that it becomes possible to implement seamless switching between source follower read-out and differential amplification read-out, reduction of random noises, and a solid-state imaging device and an electronic apparatus having an improved PRNU characteristic, for example.

2. First Embodiment

Next, the following describes the solid-state imaging device and the electronic apparatus according to the first embodiment in detail with reference to the drawings.

2.1 System Configuration Example of CMOS Image Sensor

Figure 5:
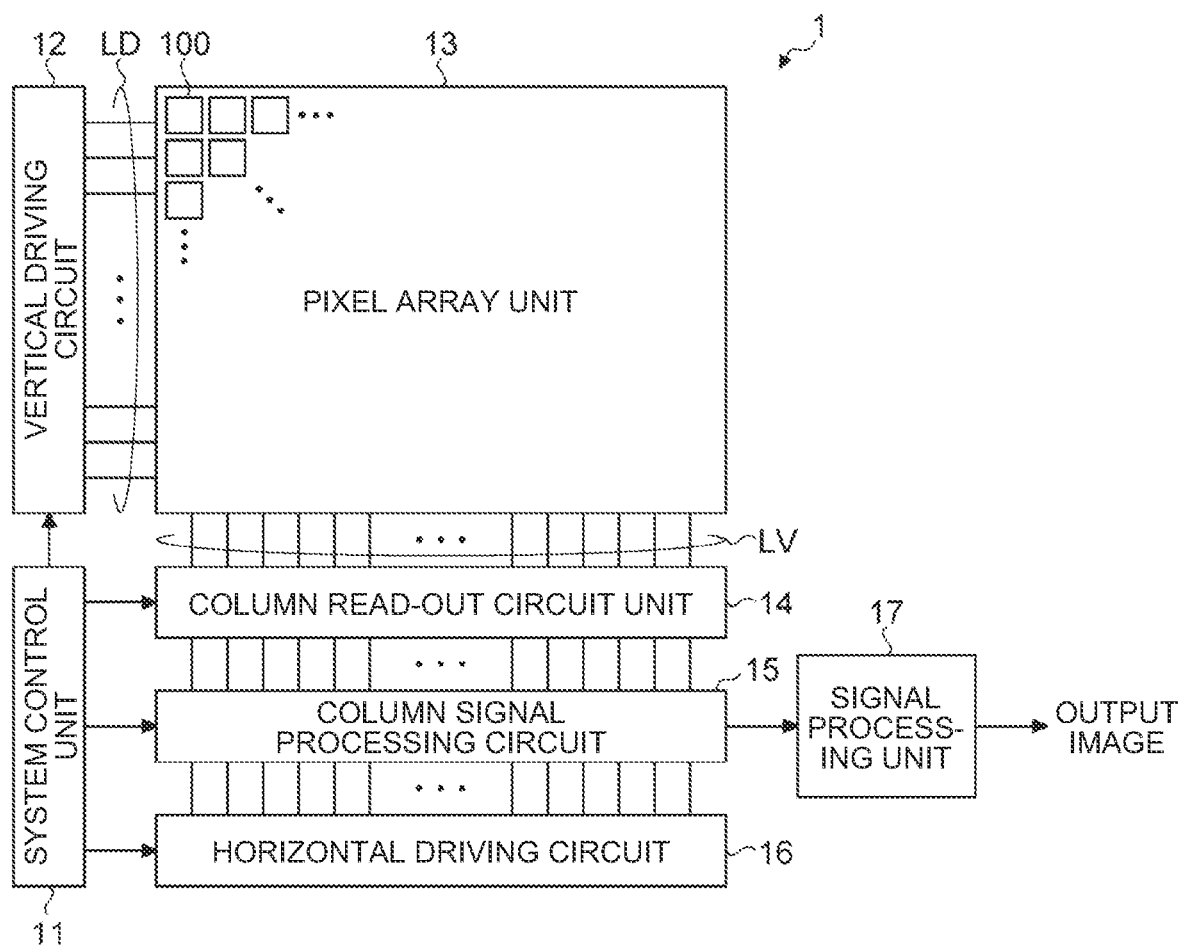
FIG. 5 is a system configuration diagram illustrating a schematic configuration example of the CMOS image sensor serving as a solid-state imaging device mounted on an electronic apparatus according to a first embodiment.

FIG. 5 is a system configuration diagram illustrating a schematic configuration example of the CMOS image sensor as the solid-state imaging device mounted on the electronic apparatus according to the present embodiment. As illustrated in FIG. 5, a CMOS image sensor 1 includes a pixel array unit 13, a vertical drive circuit 12, a column read-out circuit unit 14, a column signal processing circuit 15, a horizontal drive circuit 16, a system control unit 11, and a signal processing unit 17. The pixel array unit 13, the vertical drive circuit 12, the column read-out circuit unit 14, the column signal processing circuit 15, the horizontal drive circuit 16, the system control unit 11, and the signal processing unit 17 are disposed on the same semiconductor substrate (chip) or a plurality of laminated semiconductor substrates (chip) that are electrically connected to each other.

In the pixel array unit 13, effective unit pixels (hereinafter, referred to as unit pixels) 100 are two-dimensionally arranged in a matrix, the unit pixel 100 including a photoelectric conversion element (PD 101) that can photoelectrically convert a charge amount corresponding to an incident light quantity to be accumulated therein and output as a signal. The pixel array unit 13 may include a region in which a dummy unit pixel having a structure without the PD, a light-shielding unit pixel in which light incident from the outside is shielded by shielding a light receiving surface from light, and the like are arranged in a row and/or column shape in addition to the effective unit pixel 100. The light-shielding unit pixel may have the same configuration as that of the effective unit pixel 100 except the structure in which the light receiving surface is shielded from light.

In the following description, an optical charge having a charge amount corresponding to the incident light quantity may be simply referred to as an "electric charge", and the unit pixel 100 may be simply referred to as a "pixel".

In the pixel array unit 13, a pixel driving line LD is formed for each row of the pixel array in a matrix along a horizontal direction of the drawing (an arrangement direction of the pixels in a pixel row), and vertical pixel wiring LV is formed for each column along a vertical direction of the drawing (an arrangement direction of the pixels in a pixel column). One end of the pixel driving line LD is connected to an output end of the vertical drive circuit 12 corresponding to each row.

The column read-out circuit unit 14 includes at least a circuit that supplies a constant current for each column to the unit pixel 100 in a selected row within the pixel array unit 13, a current mirror circuit, a changeover switch for switching the unit pixel 100 to be read out, and the like, constitutes the amplifier together with the transistor in a selected pixel in the pixel array unit 13, and converts an optical charge signal into a voltage signal to be output to the vertical pixel wiring LV.

The vertical drive circuit 12 includes a shift register, an address decoder, and the like, and drives the unit pixels 100 in the pixel array unit 13 all at the same time, or row by row, for example. A specific configuration of the vertical drive circuit 12 is not illustrated, but the vertical drive circuit 12 has a configuration including a read-out scanning system, and a sweep scanning system or a batch sweep and batch transfer system.

The read-out scanning system selectively scans the unit pixels 100 of the pixel array unit 13 row by row to read out the pixel signal from the unit pixel 100. In a case of row driving (a rolling shutter operation), regarding a sweep, sweep scanning is performed on a read-out row on which read-out scanning is performed by the read-out scanning system preceding the read-out scanning corresponding to a time of shutter speed. In a case of global exposure (a global shutter operation), a batch sweep is performed preceding batch transfer corresponding to a time of shutter speed. Due to such a sweep, unnecessary electric charges are swept (reset) from the PD 101 of the unit pixel 100 in the read-out row. Due to the sweep (reset) of the unnecessary electric charges, what is called an electronic shutter operation is performed.

In this case, the electronic shutter operation means an operation of discarding unnecessary optical charges that are accumulated in the PD 101 immediately before the operation and newly starting exposure (starting accumulation of optical charges).

The signal level of the pixel signal that is read out through a read-out operation performed by the read-out scanning system corresponds to an amount of light that is incident after a preceding read-out operation or the electronic shutter operation. In a case of row driving, a period from a read-out timing by the preceding read-out operation or a sweep timing by the electronic shutter operation to a read-out timing by the present read-out operation becomes an accumulation time (exposure time) for the optical charge in the unit pixel 100. In a case of global exposure, a time from a batch sweep to batch transfer becomes the accumulation time (exposure time).

The pixel signal output from each of the unit pixels 100 in the pixel row that is selectively scanned by the vertical drive circuit 12 is supplied to the column signal processing circuit 15 through each piece of the vertical pixel wiring LV. The column signal processing circuit 15 performs predetermined signal processing on the pixel signal output from each of the unit pixels 100 in the selected row via the vertical pixel wiring LV for each pixel column of the pixel array unit 13, and temporarily holds the pixel signal after the signal processing.

Specifically, the column signal processing circuit 15 performs, for example, noise removal processing and correlated double sampling (CDS) processing as the signal processing. Through the CDS processing performed by the column signal processing circuit 15, fixed pattern noises specific to the pixel such as reset noises and threshold variations of the amplification transistor 105 are removed. The column signal processing circuit 15 can also be configured to have an AD conversion function in addition to the noise removal processing, for example, and to output the pixel signal as a digital signal.

The horizontal drive circuit 16 includes a shift register, an address decoder, and the like, and selects a unit circuit corresponding to the pixel column of the column signal processing circuit 15 in order. Through selective scanning performed by the horizontal drive circuit 16, the pixel signal on which signal processing is performed by the column signal processing circuit 15 is output to the signal processing unit 17 in order.

The system control unit 11 includes a timing generator and the like that generate various timing signals, and performs driving control on the vertical drive circuit 12, the column signal processing circuit 15, the horizontal drive circuit 16, and the like based on the various timing signals generated by the timing generator.

The CMOS image sensor 1 further includes the signal processing unit 17 and a data storage unit (not illustrated). The signal processing unit 17 has at least an addition processing function, and performs various kinds of signal processing such as addition processing on the pixel signal output from the column signal processing circuit 15. In the signal processing performed by the signal processing unit 17, the data storage unit temporarily stores data required for the processing. The signal processing unit 17 and the data storage unit may be mounted on the same substrate as that of the CMOS image sensor 1, or the signal processing unit 17 and the data storage unit may be external signal processing units disposed on a substrate different from that of the CMOS image sensor 1, for example, the processing may be performed by a digital signal processor (DSP) or software.

2.2 Circuit Configuration Example of Unit Pixel

Next, the following describes a circuit configuration example of the unit pixels 100 disposed in the pixel array unit 13 in FIG. 5 in a matrix.

Figure 6:
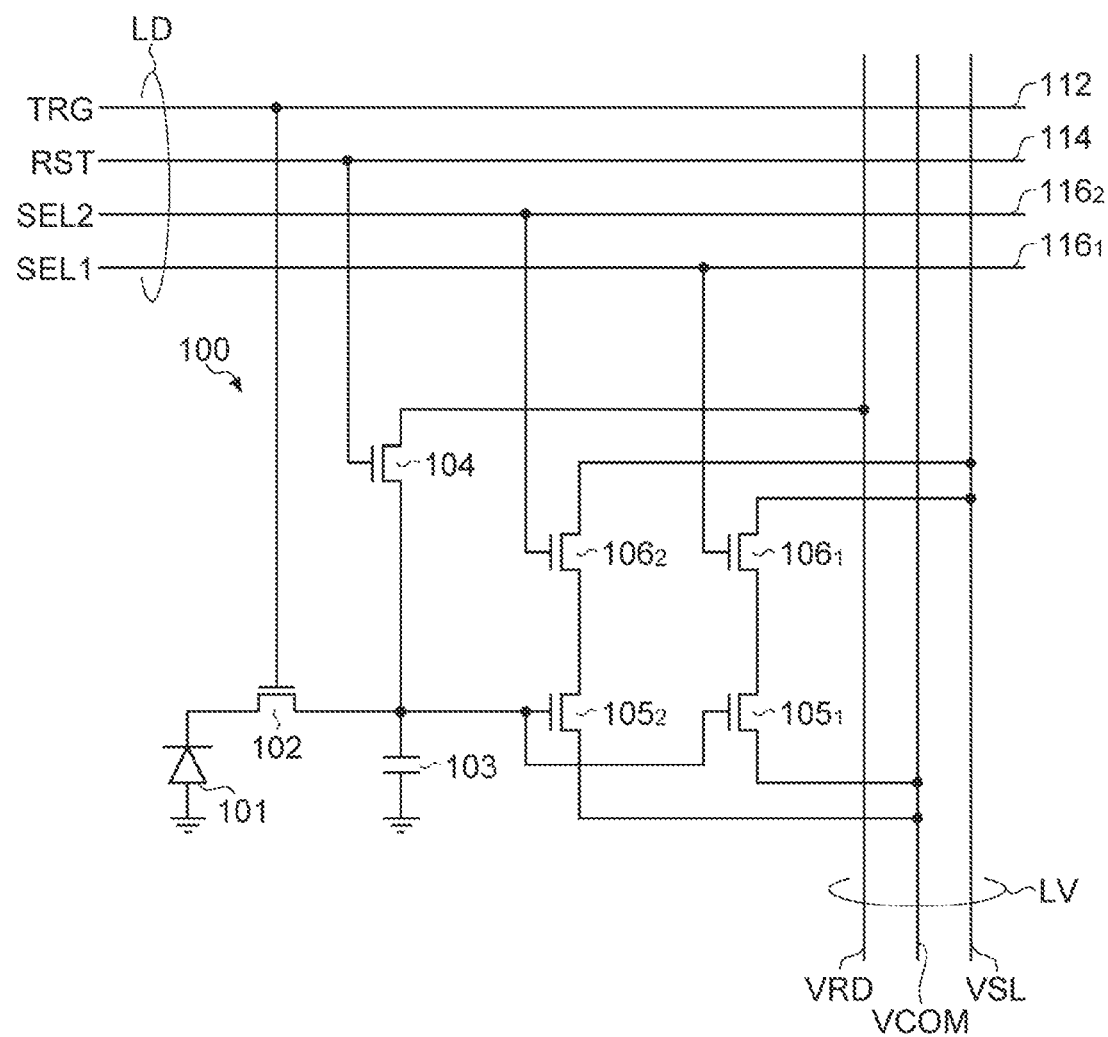
FIG. 6 is a circuit diagram illustrating a schematic configuration example of a unit pixel in an effective pixel region according to the first embodiment.

FIG. 6 is a circuit diagram illustrating a schematic configuration example of the unit pixel in the effective pixel region according to the present embodiment. As illustrated in FIG. 6, the unit pixel 100 is constituted of the PD 101, a transfer transistor 102, a reset transistor 104, a first amplification transistor $105_1$, a first selection transistor $106_1$, a second amplification transistor $105_2$, a second selection transistor $106_2$, a first selection transistor driving line $116_1$ serving as the pixel driving line LD the one end of which is connected to the vertical drive circuit 12, a second selection transistor driving line $116_2$, a reset transistor driving line 114, a transfer transistor driving line 112, a vertical signal line VSL serving as the vertical pixel wiring LV the one end of which is connected to the column read-out circuit unit 14, a vertical reset input line VRD, and a vertical current supply line VCOM.

The PD 101 photoelectrically converts incident light. The transfer transistor 102 transfers an electric charge generated in the PD 101. an FD 103 accumulates the electric charge transferred by the transfer transistor 102. The first and the second amplification transistors $105_1$ and $105_2$ cause a pixel signal having a voltage corresponding to the electric charge accumulated in the FD 103 to appear in the vertical signal line VSL. The reset transistor 104 discharges the electric charge accumulated in the FD 103. The first and the second selection transistors $106_1$ and $106_2$ select the unit pixel 100 to be read out.

An anode of the PD 101 is grounded, and a cathode thereof is connected to a source of the transfer transistor 102. A drain of the transfer transistor 102 is connected to a source of the reset transistor 104 and gates of the first and the second amplification transistors $105_1$ and $105_2$, and a connection point thereof configures a node that functions as the FD 103. The reset transistor 104 is disposed between the FD 103 and the vertical reset input line VRD in series.

A drain of the reset transistor 104 is connected to the vertical reset input line VRD. Each of sources of the first and the second amplification transistors $105_1$ and $105_2$ is connected to the vertical current supply line VCOM. A drain of the first amplification transistor $105_1$ is connected to a source of the first selection transistor $106_1$, and a drain of the second amplification transistor $105_2$ is connected to a source of the second selection transistor $106_2$. Each of drains of the first and the second selection transistors $106_1$ and $106_2$ is connected to the vertical signal line VSL.

Each of a gate of the transfer transistor 102, a gate of the reset transistor 104, and gates of the first and the second selection transistors $106_1$ and $106_2$ is connected to the vertical drive circuit 12 via the pixel driving line LV, and a pulse as a driving signal is supplied thereto.

In this way, the unit pixel 100 according to the present embodiment has a configuration in which the gates of the two amplification transistors ($105_1$ and $105_2$) are connected to the FD 103 in parallel. In other words, the unit pixel 100 according to the present embodiment has a two-finger configuration in which the amplification transistor is divided into two parts. Due to this, the overlap capacitance $C_{gd}$ between the FD 103 and the vertical signal line VSL can be increased two times, for example, so that the conversion efficiency $\eta_{vsl}$ can be lowered efficiently.

In the present embodiment, the selection transistors ($106_1$ and $106_2$) corresponding to the two amplification transistors ($105_1$ and $105_2$) on a one-to-one basis are disposed, so that the conversion efficiency $\eta_{vsl}$ can be adjusted depending on a situation and the like. For example, control can be performed not to select one of the first and the second amplification transistors $105_1$ and $105_2$ in a situation in which high conversion efficiency $\eta_{vsl}$ is required, and to select both of the first and the second amplification transistors $105_1$ and $105_2$ in a case of lowering the conversion efficiency $\eta_{vsl}$.

2.3 Basic Function Example of Unit Pixel

Next, the following describes a basic function of the unit pixel 100. The reset transistor 104 turns ON/OFF discharge of the electric charge accumulated in the FD 103 in accordance with a reset signal RST supplied from the vertical drive circuit 12. When the reset signal RST of High level is input to the gate of the reset transistor 104, the FD 103 is clamped to a voltage that is applied through the vertical reset input line VRD. Due to this, the electric charge accumulated in the FD 103 is discharged (reset). When the reset signal RST of Low level is input to the gate of the reset transistor 104, the FD 103 is electrically disconnected from the vertical reset input line VRD, and caused to be in a floating state.

The PD 101 photoelectrically converts incident light, and generates an electric charge corresponding to an amount of the light. The generated electric charge is accumulated on a cathode side of the PD 101. The transfer transistor 102 turns ON/OFF transfer of the electric charge from the PD 101 to the FD 103 in accordance with a transfer control signal TRG supplied from the vertical drive circuit 12. For example, when the transfer control signal TRG of High level is input to the gate of the transfer transistor 102, the electric charge accumulated in the PD 101 is transferred to the FD 103. On the other hand, when the transfer control signal TRG of Low level is supplied to the gate of the transfer transistor 102, transfer of the electric charge from the PD 101 is stopped. During a period in which the transfer transistor 102 stops transfer of the electric charge to the FD 103, the electric charge that is photoelectrically converted is accumulated in the PD 101.

The FD 103 has a function of accumulating the electric charge that is transferred from the PD 101 via the transfer transistor 102, and converting the electric charge into a voltage. Thus, in the floating state in which the reset transistor 104 is turned OFF, an electric potential of the FD 103 is modulated in accordance with a charge amount accumulated therein.

Each of the first and the second amplification transistors $105_1$ and $105_2$ functions as an amplifier using a potential variation of the FD 103 connected to the gate thereof as an input signal, and an output voltage signal thereof is output as a pixel signal to the vertical signal line VSL via the first or the second selection transistor $106_1$ or $106_2$ connected to the drain thereof.

The first selection transistor $106_1$ turns ON/OFF output of the voltage signal from the first amplification transistor $105_1$ to the vertical signal line VSL in accordance with a selection control signal SEL1 supplied from the vertical drive circuit 12. For example, when the selection control signal SEL1 of High level is input to the gate of the first selection transistor $106_1$, the voltage signal from the first amplification transistor $105_1$ is output to the vertical signal line VSL, and when the selection control signal SEL1 of Low level is input thereto, output of the voltage signal to the vertical signal line VSL is stopped.

Similarly, the second selection transistor $106_2$ turns ON/OFF an output of a voltage signal from the second amplification transistor $105_2$ to the vertical signal line VSL in accordance with a selection control signal SEL2 supplied from the vertical drive circuit 12. For example, when the selection control signal SEL2 of High level is input to the gate of the second selection transistor $106_2$, a voltage signal from the second amplification transistor $105_2$ is output to the vertical signal line VSL. When the selection control signal SEL2 of Low level is input thereto, an output of the voltage signal to the vertical signal line VSL is stopped.

Through these operations, an output of the selected unit pixel 100 can be extracted in the vertical signal line VSL to which a plurality of the unit pixels 100 are connected.

2.4 Layout Example of Unit Pixel

Next, the following describes a pixel layout in a case of building the unit pixel 100 onto one chip in detail with reference to the drawing.

Figure 7:
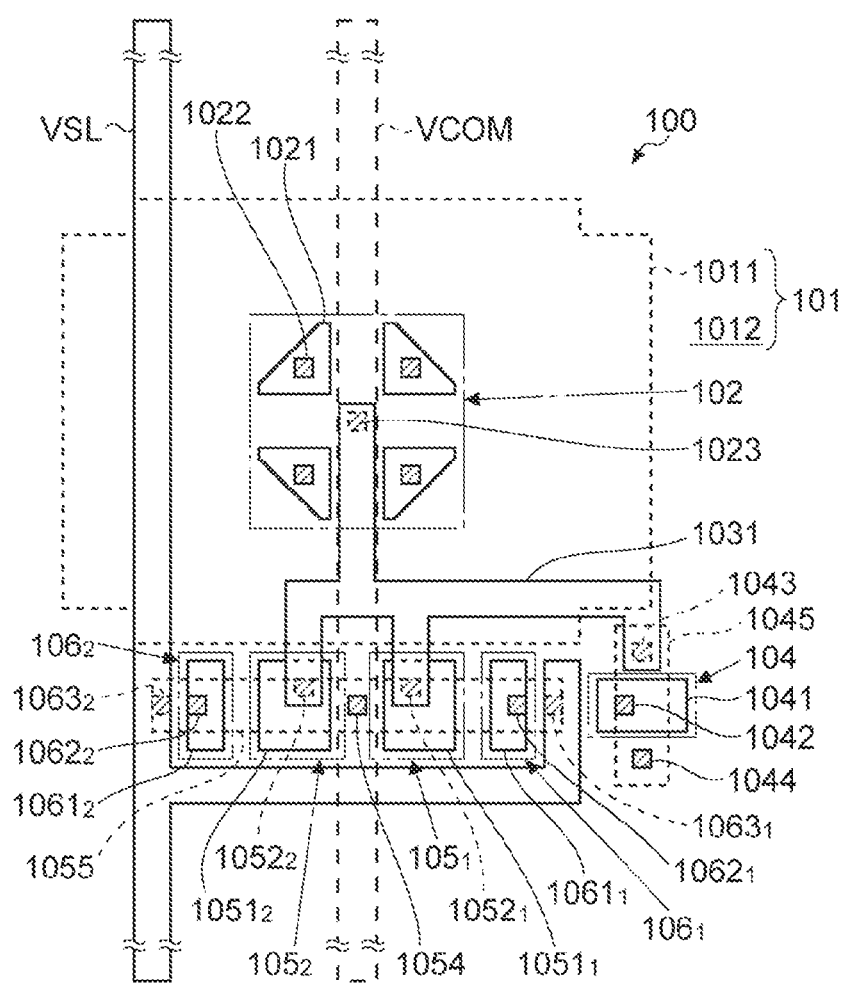
FIG. 7 is an upper view illustrating a layout example of a unit pixel according to the first embodiment.

FIG. 7 is an upper view illustrating a layout example of the unit pixel according to the present embodiment. As illustrated in FIG. 7, in the unit pixel 100, the PD 101 is formed of an n-type semiconductor region 1011 formed on a semiconductor substrate, and a p-type semiconductor region 1012 surrounding the n-type semiconductor region 1011. The transfer transistor 102 is disposed at substantially the center of the n-type semiconductor region 1011 of the PD 101, for example. In a region adjacent to the n-type semiconductor region 1011, the first and the second amplification transistors $105_1$ and $105_2$, and the first and the second selection transistors $106_1$ and $106_2$ are disposed in a line symmetric manner about the vertical current supply line VCOM extending through substantially the center of the n-type semiconductor region 1011 in a column direction as an axis, for example. Furthermore, the reset transistor 104 is disposed in a region that is adjacent to the n-type semiconductor region 1011 and close to a corner part of the n-type semiconductor region 1011.

The transfer transistor 102 includes, for example, a plurality of (in FIG. 7, four) gates 1021 that are disposed in a point symmetric manner with respect to the center of the n-type semiconductor region 1011. Each of the gates 1021 is, for example, connected to the transfer transistor driving line 112 (refer to FIG. 6) via an electrode 1022.

A drain of the transfer transistor 102 is connected to one end of wiring 1031 via an electrode 1023. This wiring 1031 is, for example, a node constituting the FD 103.

The other end of the wiring 1031 branches into three ends, for example. One of the branched three ends is, for example, connected to a source of the reset transistor 104 via an electrode 1043. One of the remaining two ends is, for example, connected to a gate $1051_1$ of the first amplification transistor $105_1$ via an electrode $1052_1$, and the other one thereof is, for example, connected to a gate $1051_2$ of the second amplification transistor $105_2$ via an electrode $1052_2$. Due to this, the unit pixel 100 has a two-finger configuration in which the amplification transistor is divided into two parts.

The first and the second amplification transistors $105_1$ and $105_2$, and the first and the second selection transistors $106_1$ and $106_2$ are, for example, formed in a belt-shaped element formation region 1055 that is formed in a region adjacent to the n-type semiconductor region 1011. Due to this, a source of the first amplification transistor $105_1$ and a source of the second amplification transistor $105_2$, a drain of the first amplification transistor $105_1$ and a source of the first selection transistor $106_1$, and a drain of the second amplification transistor $105_2$ and a source of the second selection transistor $106_2$ are respectively made common to each other.

The common sources of the first and the second amplification transistors $105_1$ and $105_2$ are connected to the vertical current supply line VCOM via an electrode 1054, for example.

The drain of the first selection transistor $106_1$ is connected to the vertical signal line VSL via an electrode $1063_1$, for example. Similarly, the drain of the second selection transistor $106_2$ is connected to the vertical signal line VSL via an electrode $1063_2$, for example.

A gate $1061_1$ of the first selection transistor $106_1$ is, for example, connected to a selection transistor driving line $116_1$ (refer to FIG. 6) via an electrode $1062_1$. Similarly, a gate $1061_2$ of the second selection transistor $106_2$ is, for example, connected to a selection transistor driving line $116_2$ (refer to FIG. 6) via an electrode $1062_2$.

The reset transistor 104 is, for example, formed in an element formation region 1045 that is formed in a region adjacent to the n-type semiconductor region 1011 and close to a corner part of the n-type semiconductor region 1011. The drain of the reset transistor 104 is, for example, connected to the vertical reset input line VRD (refer to FIG. 6) via an electrode 1044. A gate 1041 of the reset transistor 104 is, for example, connected to the reset transistor driving line 114 (refer to FIG. 6) via an electrode 1042.

2.5 Example of Differential Amplification Read-Out Circuit

Next, the following describes the differential amplification read-out circuit including the unit pixels 100 that are two-dimensionally arranged in the pixel array unit 13 in a matrix and the column read-out circuit unit 14.

Figure 8:
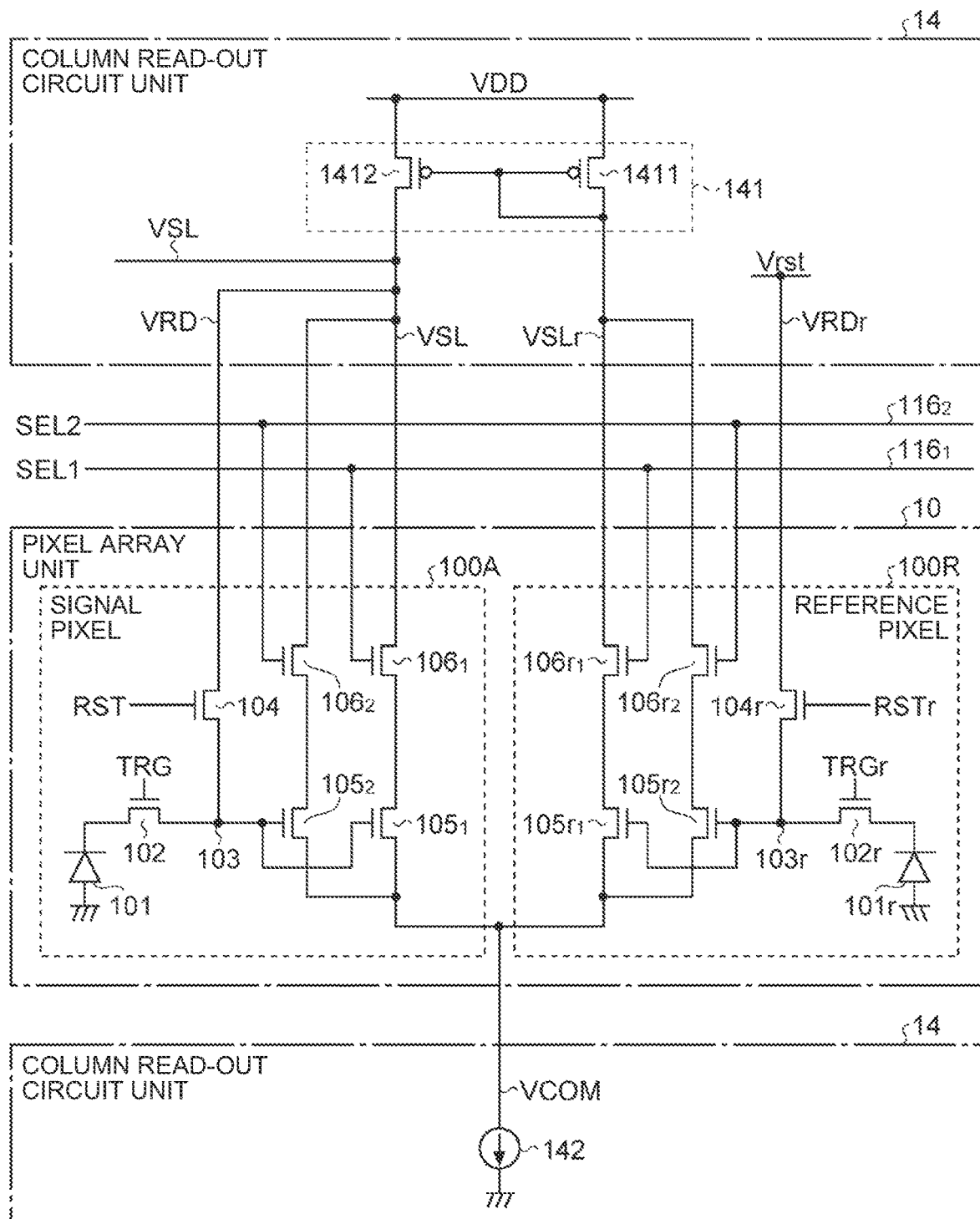
FIG. 8 is a circuit diagram illustrating a schematic configuration example of a differential amplification read-out circuit according to the first embodiment.

FIG. 8 is a circuit diagram illustrating a schematic configuration example of the differential amplification read-out circuit according to the present embodiment. The differential amplification read-out circuit illustrated in FIG. 8 is constituted of a unit pixel from which a pixel signal is read out (hereinafter, referred to as a read-out pixel or a signal pixel) 100A, a unit pixel that gives a reference voltage for differential amplification (hereinafter, referred to as a reference pixel) 100R, a current mirror circuit 141 constituted of a PMOS transistors 1411 and 1412 disposed in the column read-out circuit unit 14, and a tail current source unit 142 that supplies a constant current to the signal pixel 100A and the reference pixel 100R.

In this case, the reference pixel 100R is preferably the unit pixel 100 in which a potential variation of FD 103r at the time of reset is equivalent to a potential variation of the FD 103 of the signal pixel 100A, and may be, for example, an inactive effective pixel after read-out in the vicinity of the signal pixel 100A to be read out. In the description about FIG. 8 and the following, for clarification, "r" is added to a reference numeral of each configuration on the reference pixel 100R side.

A vertical reset input line VRDr on the reference pixel 100R side is connected to a predetermined power supply Vrst (or a power supply voltage VDD) in the column read-out circuit unit 14, and at the time of reset, a desired input voltage signal is applied to the FD 103r of the reference pixel 100R that is selected via the vertical reset input line VRDr, that is, input terminals of first and second amplification transistors $105r_1$ and $105r_2$ on the reference pixel 100R side.

The vertical signal line VSLr on the reference pixel 100R side is connected to a drain and a gate of the PMOS transistor 1411 on a reference side of the current mirror circuit 141 and a gate of the PMOS transistor 1412 on a read-out side in the column read-out circuit unit 14.

On the other hand, the vertical signal line VSL on the signal pixel 100A side is connected to a drain of the PMOS transistor 1412 on the read-out side of the current mirror circuit 141 in the column read-out circuit unit 14, and the FD 103 of the selected signal pixel 100A, that is, input terminals of the first and the second amplification transistors $105_1$ and $105_2$ on the signal pixel 100A side via the reset transistor 104. Due to this, an output signal of the differential amplification read-out circuit (differential amplifier circuit) constituted of the pixel array unit 13 and the column read-out circuit unit 14 is negatively fed back. The output signal of the differential amplification read-out circuit is also extracted as a pixel signal from the vertical signal line VSL1.

Vertical current supply lines VCOM on the reference side and the read-out side are connected to each other, and thereafter connected to the tail current source unit 142 as a constant current source configured by using a load MOS transistor such as an NMOS transistor, for example.

2.6 Driving Example of Differential Amplification Read-Out Circuit

Next, the following describes a driving example of the differential amplification read-out circuit. For clarification, the following description is based on the differential amplification read-out circuit illustrated in FIG. 8.

2.6.1 First Differential Read-Out Mode (High Conversion Efficiency)

Figure 9:
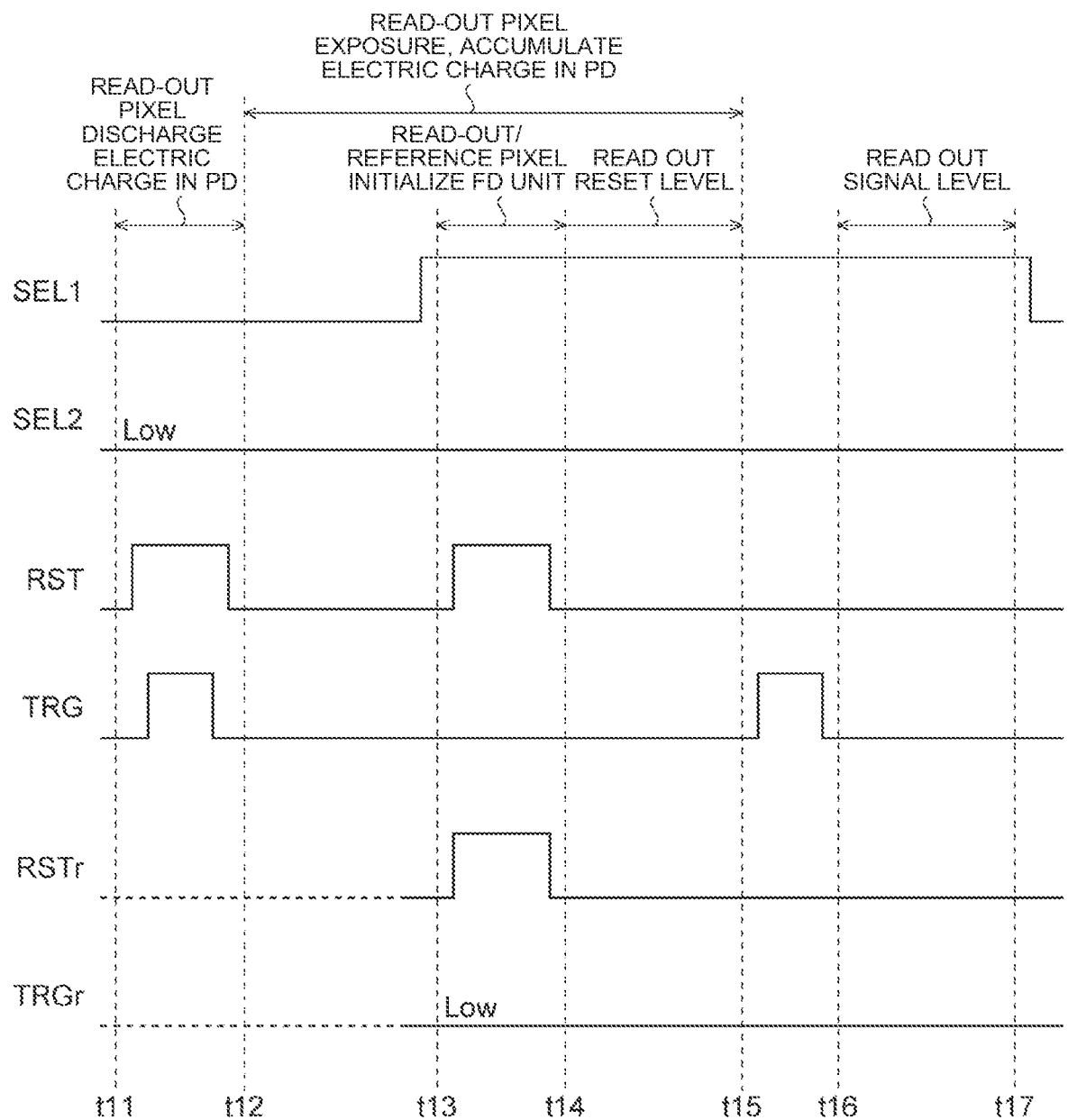
FIG. 9 is a timing chart illustrating a driving example in a first differential read-out mode of the differential amplification read-out circuit according to the first embodiment.

FIG. 9 is a timing chart illustrating a driving example in a first differential read-out mode of the differential amplification read-out circuit according to the present embodiment. The first differential read-out mode is a read-out mode that implements high conversion efficiency $\eta_{vs1}$ by causing the second amplification transistor $105_2$ of the two amplification transistors ($105_1$ and $105_2$) not to be selected at all times (the selection control signal SEL2 is Low at all times).

As illustrated in FIG. 9, in the first read-out mode, first, when a reset signal RST and a transfer control signal TRG input to the signal pixel 100A rise to High level in a period from a time t11 to a time t12, the electric charges accumulated in the PD 101 and the FD 103 of the signal pixel 100A are discharged via the reset transistor 104. Due to this, the electric charges that have been accumulated in the PD 101 are swept, and electric charges that are newly obtained by photoelectrically converting incident light are accumulated in the PD 101 in a period from the time t12 to a time t15.

Next, when a selection control signal SEL1 of the selected signal pixel 100A and reference pixel 100R rise from Low level to High level in a period from a time t13 to a time t17, a current is supplied from the tail current source unit 142 in a direction from respective sources of the first amplification transistor $105_1$ of the signal pixel 100A and the first amplification transistor $105r_1$ of the reference pixel 100R to respective drains thereof. Due to this, the differential amplifier circuit (differential amplification read-out circuit) using the electric potential of the FD 103 of the signal pixel 100A as an input voltage signal operates, and as a result, an amplified voltage signal is output to the vertical signal line VSL. This state continues until the selection control signal SEL1 becomes at Low level at the time t17.

In the period from the time t11 to the time t13, each of driving signals SEL1, SEL2, RSTr, and TRGr of the reference pixel 100R does not contribute to signal read-out of the signal pixel 100A.

When the reset signal RST input to the signal pixel 100A and the reset signal RSTr input to the reference pixel 100R rise to High level in a period from the time t13 to a time t14, the electric charges accumulated in the FD 103 of the signal pixel 100A and the FD 103r of the reference pixel 100R are discharged, and an output signal level is initialized (reset) accordingly.

At this point, an output Vout of the differential amplifier circuit is electrically connected to the FD 103 of the signal pixel 100A as one of inputs of the differential amplifier circuit via the vertical reset input line VRD and the reset transistor 104 on the signal pixel 100A side. As a result, the output Vout of the differential amplifier circuit is negatively fed back to the FD 103 of the signal pixel 100A to be in a virtual grounded state, so that the FD 103r of the reference pixel 100R that is externally applied to be fixed to a predetermined power supply Vrst, the FD 103 of the signal pixel 100A, and the output Vout have the same potential (a configuration of a voltage follower circuit).

Next, when the reset signal RST input to the signal pixel 100A and the reset signal RSTr input to the reference pixel 100R fall from High level to Low level, the FD 103 of the signal pixel 100A and the FD 103r of the reference pixel 100R are electrically disconnected from the respective vertical reset input lines VRD and VRDr to be in a floating state.

At this point, the structures of the FD 103 of the signal pixel 100A and the FD 103r of the reference pixel 100R are substantially equivalent to each other, so that potential variations at the time of reset-off (reset feedthrough) become substantially the same, and the electric potential of the FD 103 of the signal pixel 100A and the electric potential of the FD 103r of the reference pixel 100R move in substantially the same way. Thus, the output of the differential amplifier circuit is hardly changed from a voltage level of the power supply Vrst at the time of reset ON. This state is a reset (initial) state in the differential amplification read-out, and this output level is a reset (initial) level in the differential amplification read-out. This is because in-phase signal components of both inputs of the differential amplifier circuit are not amplified. This reset state continues until a signal charge is transferred at the time t15 while a voltage as the reset level is read out.

Next, when the transfer control signal TRG of the signal pixel 100A rises to High level in a pulse form in a period from the time t15 to the time t16, the electric charge accumulated in the PD 101 of the signal pixel 100A is transferred to the FD 103 via the transfer transistor 102. The electric potential of the FD 103 of the signal pixel 100A is modulated by the transferred electric charge. When the modulated electric potential is input to a gate of the first amplification transistor $105_1$ of the signal pixel 100A as a voltage signal, a voltage signal corresponding to an accumulated charge amount appears in the vertical signal line VSL on the signal pixel 100A side.

This signal read-out state continues until the selection control signal SEL1 becomes at Low level at the time t17 while a voltage as a signal level is read out.

By taking a difference between the reset level and the signal level that are read out as previously described, CDS processing for removing noises is performed, and the pixel signal from which the noises are removed is read out accordingly.

2.6.2 Second Differential Read-Out Mode (Low Conversion Efficiency)

Figure 10:
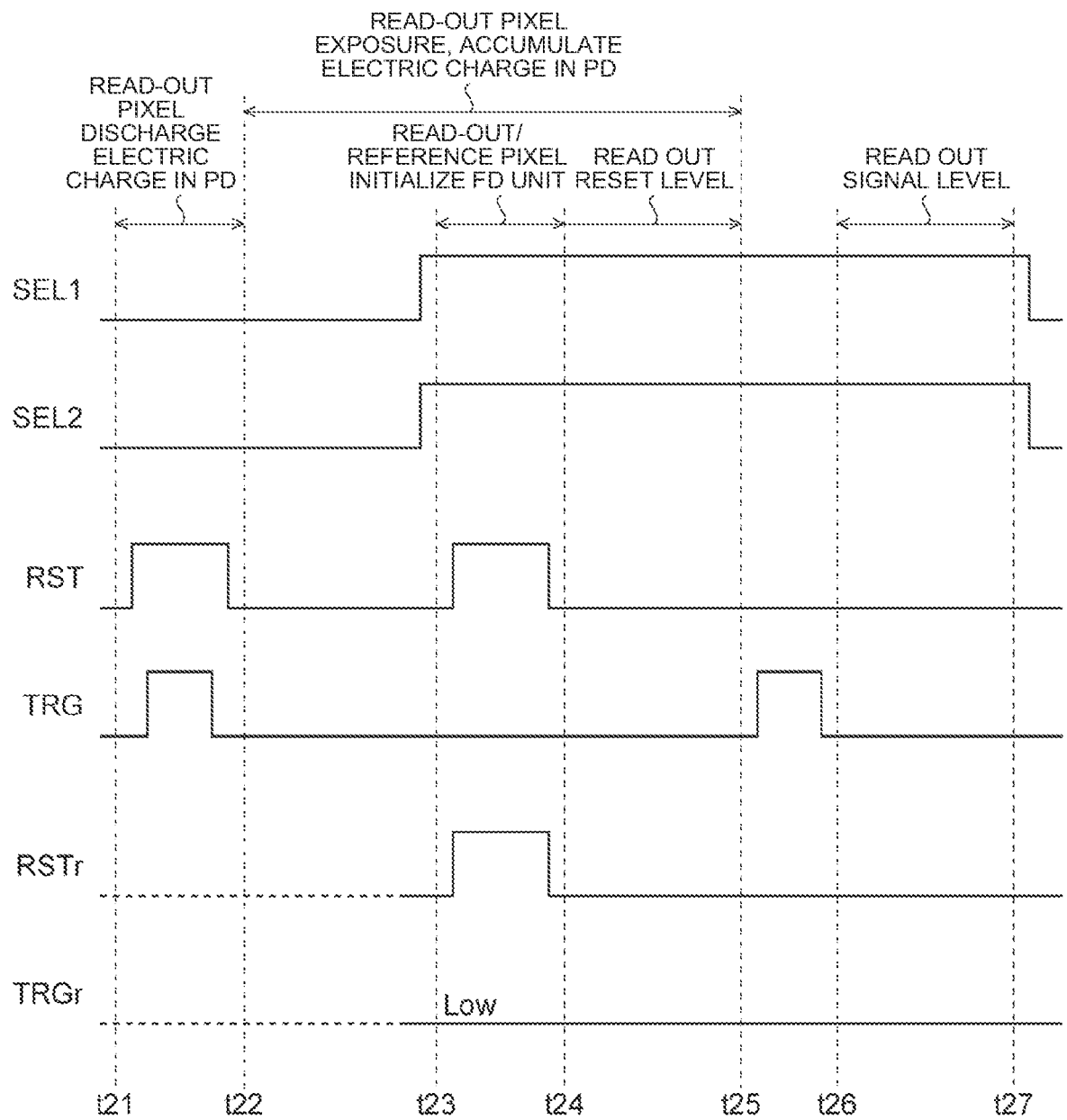
FIG. 10 is a timing chart illustrating a driving example in a second differential read-out mode of the differential amplification read-out circuit according to the first embodiment.

FIG. 10 is a timing chart illustrating a driving example in a second differential read-out mode of the differential amplification read-out circuit according to the present embodiment. The second differential read-out mode is a read-out mode in which the conversion efficiency $\eta_{vsl}$ is lowered by using both of the first amplification transistor $105_1$ and the second amplification transistor $105_2$.

As illustrated in FIG. 10, in the second read-out mode, similarly to the period from the time t11 to the time t12 in FIG. 9, when the reset signal RST and the transfer control signal TRG rise to High level in a period from a time t21 to a time t22, the electric charges accumulated in the PD 101 and the FD 103 of the signal pixel 100A are discharged via the reset transistor 104. In a period from a time t22 to a time t25, electric charges obtained by photoelectrically converting new incident light are accumulated in the PD 101.

Next, when selection control signals SEL1 and SEL2 of the selected signal pixel 100A and the reference pixel 100R rise from Low level to High level in a period from a time t23 to a time t27, a current is supplied from the tail current source unit 142 in a direction from respective sources of the first and the second amplification transistors $105_1$ and $105_2$ of the signal pixel 100A and the first and the second amplification transistors $105r_1$ and $105r_2$ of the reference pixel 100R to respective drains thereof. Due to this, the differential amplifier circuit (differential amplification read-out circuit) using the electric potential of the FD 103 of the signal pixel 100A as an input voltage signal operates, and as a result, an amplified voltage signal is output to the vertical signal line VSL. This state continues until the selection control signal SEL1 becomes at Low level at the time t27.

In the period from the time t21 to the time t23, similarly to FIG. 9, each of driving signals SEL1, SEL2, RSTr, and TRGr of the reference pixel 100R does not contribute to signal read-out of the signal pixel 100A.

When the reset signal RST input to the signal pixel 100A and the reset signal RSTr input to the reference pixel 100R rise to High level in the period from the time t23 to the time t24, similarly to the period from the time t13 to the time t14 in FIG. 9, the electric charges accumulated in the FD 103 of the signal pixel 100A and the FD 103r of the reference pixel 100R are discharged, and an output signal level is initialized (reset), accordingly. At this point, in the differential amplifier circuit, the FD 103r of the reference pixel 100R that is externally applied to be fixed to the predetermined power supply Vrst, the FD 103 of the signal pixel 100A, and the output Vout have the same electric potential (a configuration of a voltage follower circuit).

When the reset signal RST and the reset signal RSTr fall from High level to Low level, the FD 103 of the signal pixel 100A and the FD 103r of the reference pixel 100R are electrically disconnected from the respective vertical reset input lines VRD and VRDr to be in a floating state. A reset state at this point continues until a signal charge is transferred at the time t25 while a voltage as a reset level is read out.

Next, when the transfer control signal TRG of the signal pixel 100A rise to High level in a pulse form in a period from the time t25 to the time t26, the electric charge accumulated in the PD 101 of the signal pixel 100A is transferred to the FD 103 via the transfer transistor 102. The electric potential of the FD 103 of the signal pixel 100A is modulated by the transferred electric charge. When the modulated electric potential is input to respective gates of the first and the second amplification transistors $105_1$ and $105_2$ of the signal pixel 100A as a voltage signal, a voltage signal corresponding to an accumulated charge amount appears in the vertical signal line VSL on the signal pixel 100A side.

This signal read-out state continues until the selection control signals SEL1 and SEL2 become at Low level at the time t27 while a voltage as a signal level is read out.

By taking a difference between the reset level and the signal level that are read out as previously described, CDS processing for removing noises is performed, and the pixel signal from which the noises are removed is read out, accordingly.

2.7 Switching Between Differential Amplification Read-Out Circuit and Source Follower Read-Out Circuit As described above, conversion efficiency higher than that of the source follower read-out circuit is obtained in differential amplification read-out, and as represented by the expression (2) described above, the ADC noise Vn_adc and the AFE noise Vn_afe at a latter stage are suppressed. Thus, differential amplification read-out exhibits an effect in a dark photographing scene in which influence of the ADC noise Vn_adc and the AFE noise Vn_afe is increased. On the other hand, for a bright photographing scene, source follower read-out having a wider dynamic range is appropriate. In view of such circumstances, there is a demand for the CMOS image sensor 1 to enable source follower read-out and differential amplification read-out to be appropriately switched depending on a situation.

Figure 11:
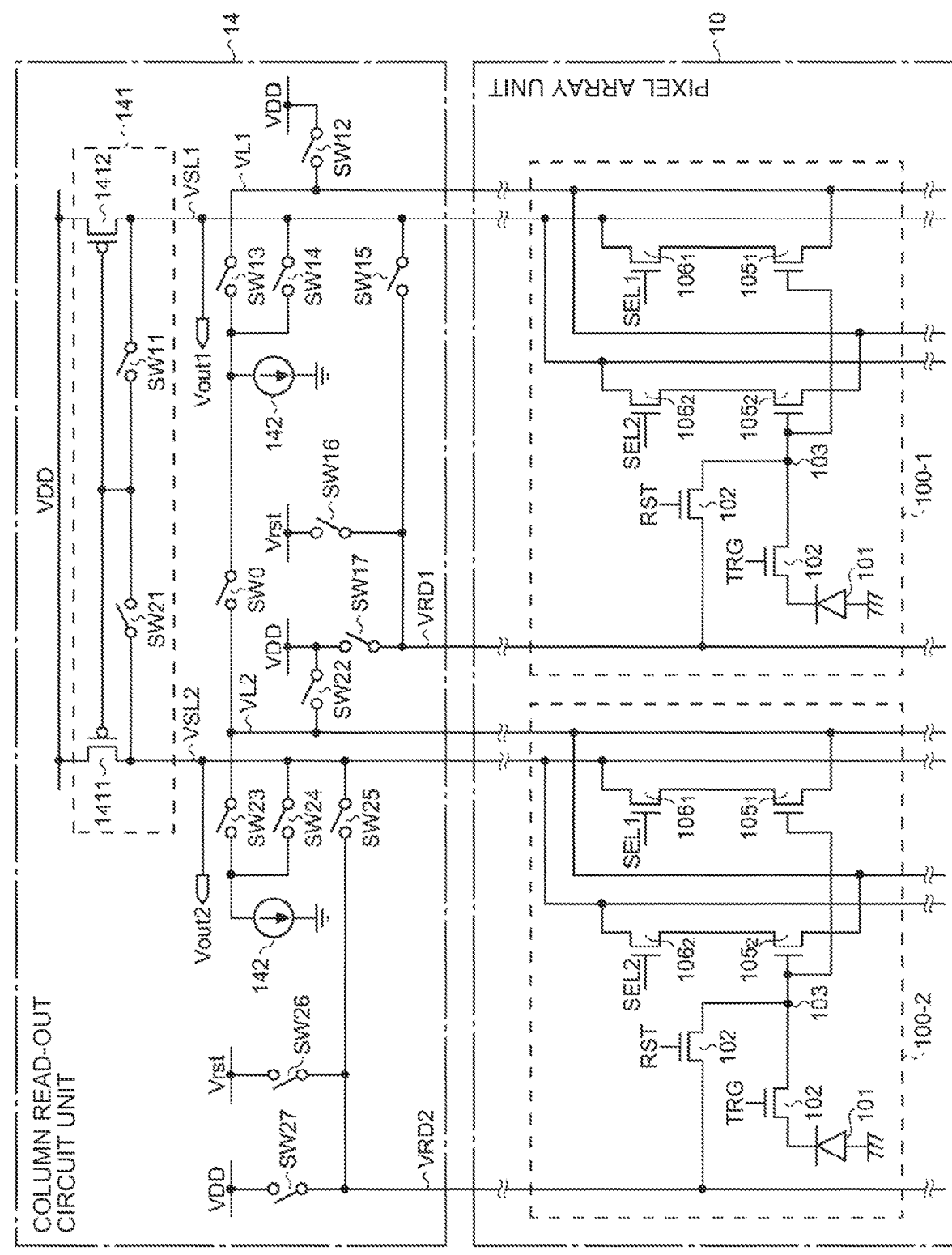
FIG. 11 is a circuit diagram illustrating a circuit configuration example including peripheral circuits enabling switching between source follower read-out and differential amplification read-out according to the first embodiment.

FIG. 11 is a circuit diagram illustrating a circuit configuration example including peripheral circuits enabling switching between source follower read-out and differential amplification read-out according to the present embodiment. FIG. 11 illustrates an example of a case of focusing on two unit pixels 100-1 and 100-2 in the pixel array unit 13, causing one of the unit pixels 100-1 and 100-2 to be a reference pixel and causing the other one thereof to be a signal pixel at the time of differential amplification read-out. The two unit pixels 100-1 and 100-2 may be the unit pixels 100 disposed in different columns of the pixel array unit 13, or may be the unit pixels 100 disposed in the same column. In a case in which the two unit pixels 100-1 and 100-2 are assumed to be the unit pixels 100 disposed in the same column, for example, the unit pixel 100-1 may be caused to be the unit pixel 100 in an even-numbered row, and the unit pixel 100-2 may be caused to be the unit pixel 100 in an odd-numbered row.

In the circuit configuration example illustrated in FIG. 11, focusing on the unit pixel 100-1, a vertical signal line VSL11 and a signal line VL1 are disposed in the unit pixel 100-1. The signal line VL1 functions as part of the vertical signal line VSL at the time of source follower read-out, and functions as the vertical current supply line VCOM at the time of differential amplification read-out.

The drain of the first selection transistor $106_1$ in the unit pixel 100-1 is connected to the vertical signal line VSL1, and the source of the first amplification transistor $105_1$ is connected to the signal line VL1. The drain of the second selection transistor $106_2$ is also connected to the vertical signal line VSL1, and a source of a second amplification transistor $VS105_2$ is also connected to the signal line VL1.

The vertical signal line VSL1 is connected to the drain of the PMOS transistor 1412, which is one of the two PMOS transistors 1411 and 1412 constituting the current mirror circuit 141. The vertical signal line VSL1 is connected to a vertical reset signal line VRD1 via a switch SW15, and is also connected to the tail current source unit 142 via a switch SW14. Furthermore, the vertical signal line VSL1 is also connected to a signal line VL2 on the unit pixel 100-2 side via the switch SW14 and a switch SW0.

The signal line VL1 is connected to the power supply voltage VDD via a switch SW12, and connected to the tail current source unit 142 via a switch SW13. Furthermore, the signal line VL1 is also connected to the vertical signal line VL2 on the unit pixel 100-2 side via the switches SW13 and SW0.

The vertical reset signal line VRD1 is connected to the power supply voltage VDD via a switch SW17, and also connected to the predetermined power supply Vrst via a switch SW16.

Focusing on the other unit pixel 100-2, a vertical signal line VSL2 and a signal line VL2 are disposed in the unit pixel 100-2. The signal line VL2 functions as part of the vertical signal line VSL at the time of source follower read-out, and functions as the vertical current supply line VCOM at the time of differential amplification read-out.

A drain of the first selection transistor $106_1$ in the unit pixel 100-2 is connected to the vertical signal line VSL2, and a source of the first amplification transistor $105_1$ is connected to the signal line VL2. A drain of the second selection transistor $106_2$ is also connected to the vertical signal line VSL2, and a source of the second amplification transistor $VS105_2$ is also connected to the signal line VL2.

The vertical signal line VSL2 is connected to a drain of the PMOS transistor 1411, which is one of the two PMOS transistors 1411 and 1412 constituting the current mirror circuit 141. The vertical signal line VSL2 is connected to a vertical reset signal line VRD2 via a switch SW25, and also connected to the tail current source unit 142 via a switch SW24.

The signal line VL2 is connected to the power supply voltage VDD via a switch SW22, and also connected to the tail current source unit 142 via a switch SW23.

The vertical reset signal line VRD1 is connected to the power supply voltage VDD via a switch SW27, and also connected to the predetermined power supply Vrst via a switch SW26.

In the current mirror circuit 141, respective gates of the PMOS transistors 1411 and 1412 are connected to a drain of the PMOS transistor 1412 via a switch SW11, and connected to a drain of the PMOS transistor 1411 via a switch SW21.

The switches SW0, SW11 to SW17, and SW21 to SW27 described above are disposed in the column read-out circuit unit 14, for example, and switch a connection state thereof in accordance with control by the system control unit 11.

2.7.1 First Connection State (Source Follower Read-Out Circuit)

Figure 12:
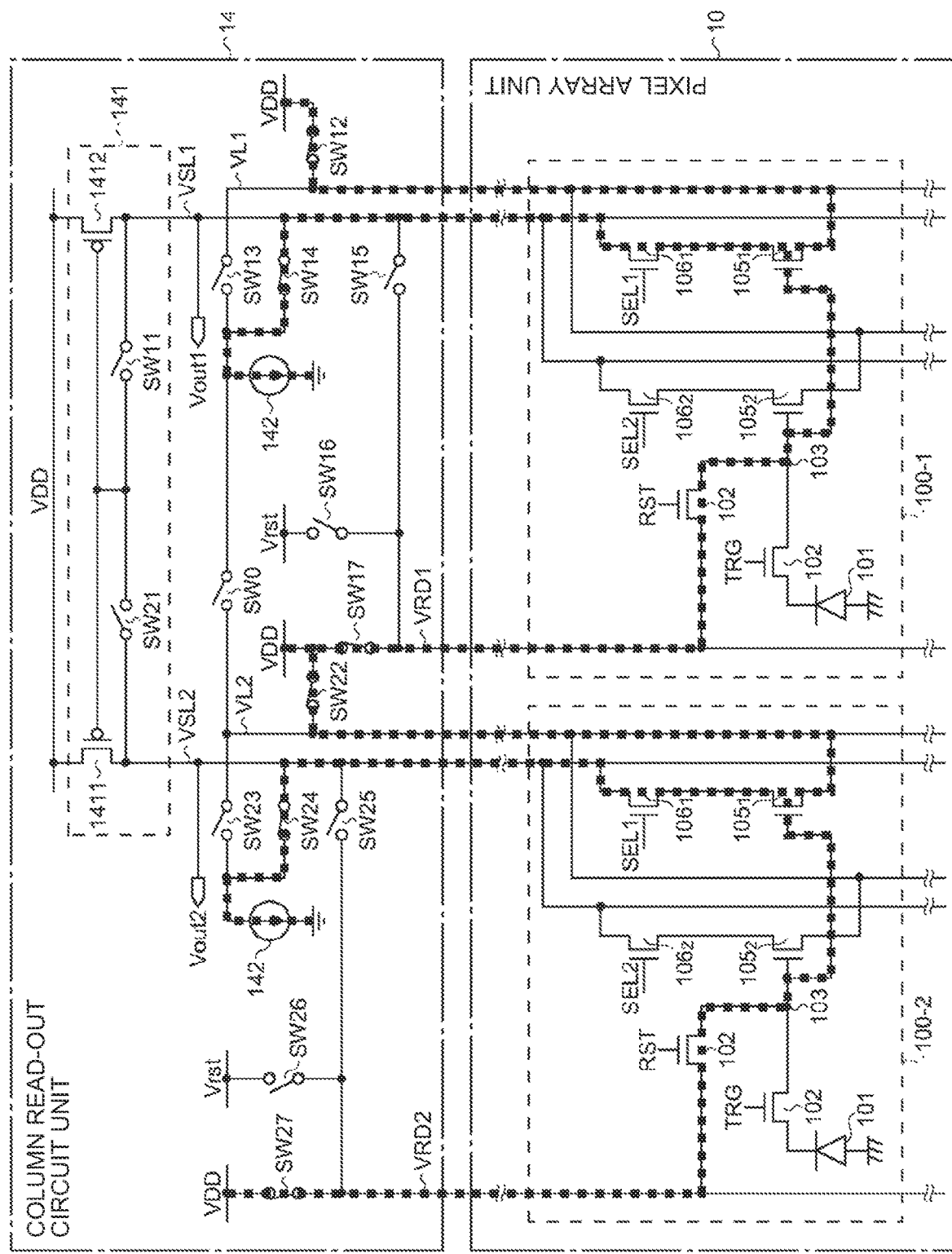
FIG. 12 is a circuit diagram illustrating a first connection state of a circuit configuration example including peripheral circuits according to the first embodiment.

Subsequently, the following describes a first connection state in a case of configuring the source follower read-out circuit in the circuit configuration exemplified in FIG. 11. FIG. 12 is a circuit diagram illustrating the first connection state according to the present embodiment. In the first connection state, the first amplification transistor $105_1$ of the two amplification transistors ($105_1$ and $105_2$) in each unit pixel 100 is used to configure the source follower read-out circuit.

As illustrated in FIG. 12, in a connection state implementing the source follower read-out circuit, the switches SW12, SW14, SW17, SW22, SW24, and SW27 are caused to be in an ON state (connected state). The other switches are in an OFF state (blocked state).

By making such a connection state, as represented by a thick dashed line in FIG. 12, the source follower read-out circuit is configured such that a source of the first amplification transistor $105_1$ of the unit pixel 100-1/100-2 and a drain of the first selection transistor $106_1$ are connected to the vertical signal line VSL (VSL1 and VL1/VSL2 and VL2) formed from the power supply voltage VDD to the tail current source unit 142 via the switches SW12 and SW14/switches SW22 and SW24 in the respective unit pixels 100-1 and 100-2, and source follower read-out is performed. A path through which the electric charges accumulated in the FD 103 of the unit pixel 100-1/100-2 are swept (reset) to the power supply voltage via the switch SW17/SW27 is also configured.

2.7.2 Second Connection State (Source Follower Read-Out Circuit)

Figure 13:
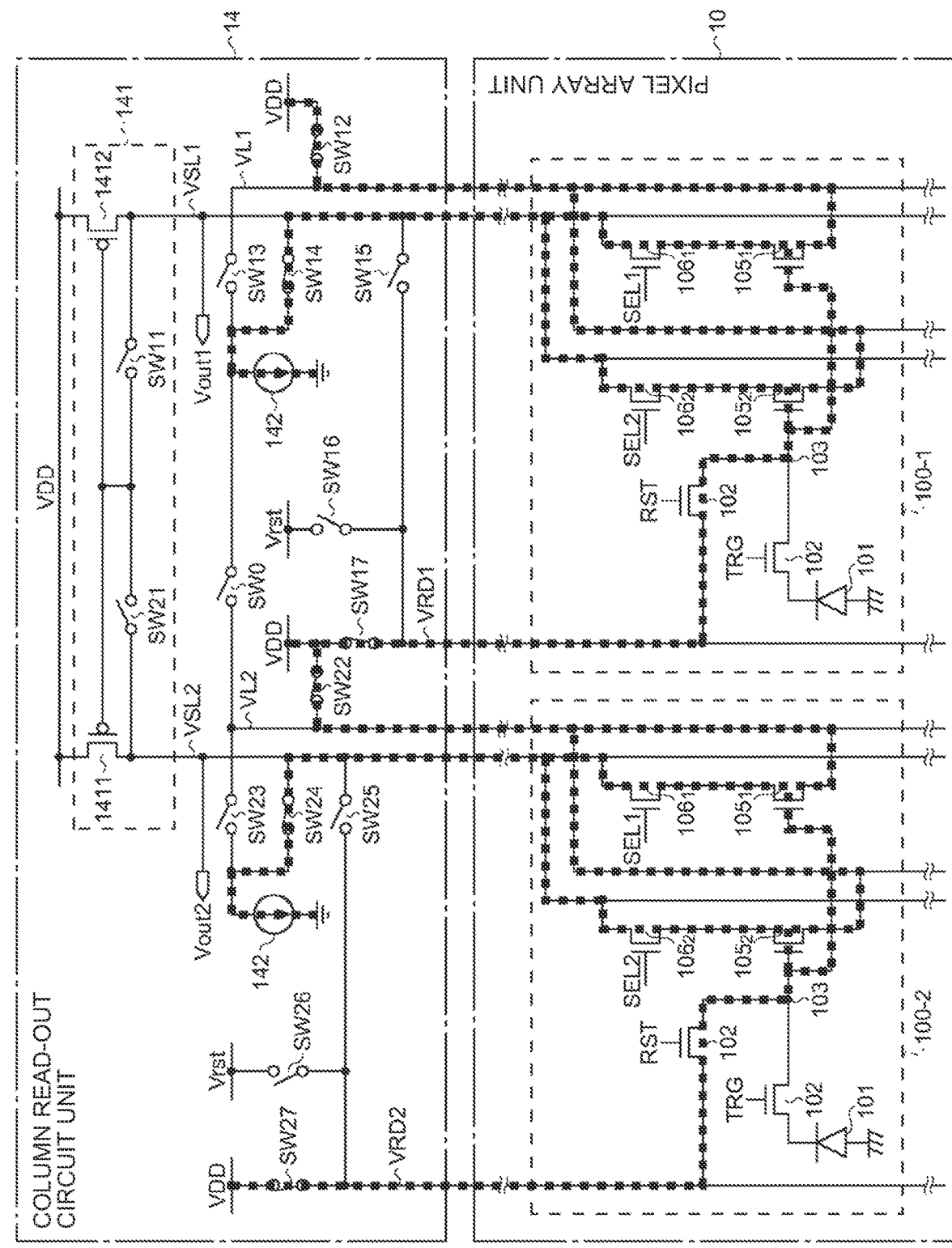
FIG. 13 is a circuit diagram illustrating a second connection state of a circuit configuration example including peripheral circuits according to the first embodiment.

Subsequently, the following describes a second connection state in a case of configuring the source follower read-out circuit in the circuit configuration exemplified in FIG. 11. FIG. 13 is a circuit diagram illustrating the second connection state according to the present embodiment. In this second connection state, the source follower read-out circuit is configured by using both of the two amplification transistors ($105_1$ and $105_2$) in each unit pixel 100.

As illustrated in FIG. 13, in the connection state implementing the source follower read-out circuit, the switches SW12, SW14, SW17, SW22, SW24, and SW27 are caused to be in the ON state. The other switches are in the OFF state.

By making such a connection state, as represented by a thick dashed line in FIG. 13, the source follower read-out circuit is configured such that sources of the first amplification transistor $105_1$ and the second amplification transistor $105_2$ of the unit pixel 100-1/100-2 and drains of the first selection transistor $106_1$ and the second selection transistor $106_2$ are connected to the vertical signal line VSL (VSL1 and VL1/VSL2 and VL2) formed from the power supply voltage VDD to the tail current source unit 142 via the switches SW12 and SW14/switches SW22 and SW24 in the respective unit pixels 100-1 and 100-2, and source follower read-out is performed. A path through which the electric charges accumulated in the FD 103 of the unit pixel 100-1/100-2 are swept (reset) to the power supply voltage via the switch SW17/SW27 is also configured.

This second connection state is a connection state that causes the conversion efficiency to be the lowest, in other words, that causes the dynamic range to be the widest, among four connection states including the first connection state described above, and third and fourth connection states described later.

2.7.3 Third Connection State (Differential Amplification Read-Out Circuit)

Figure 14:
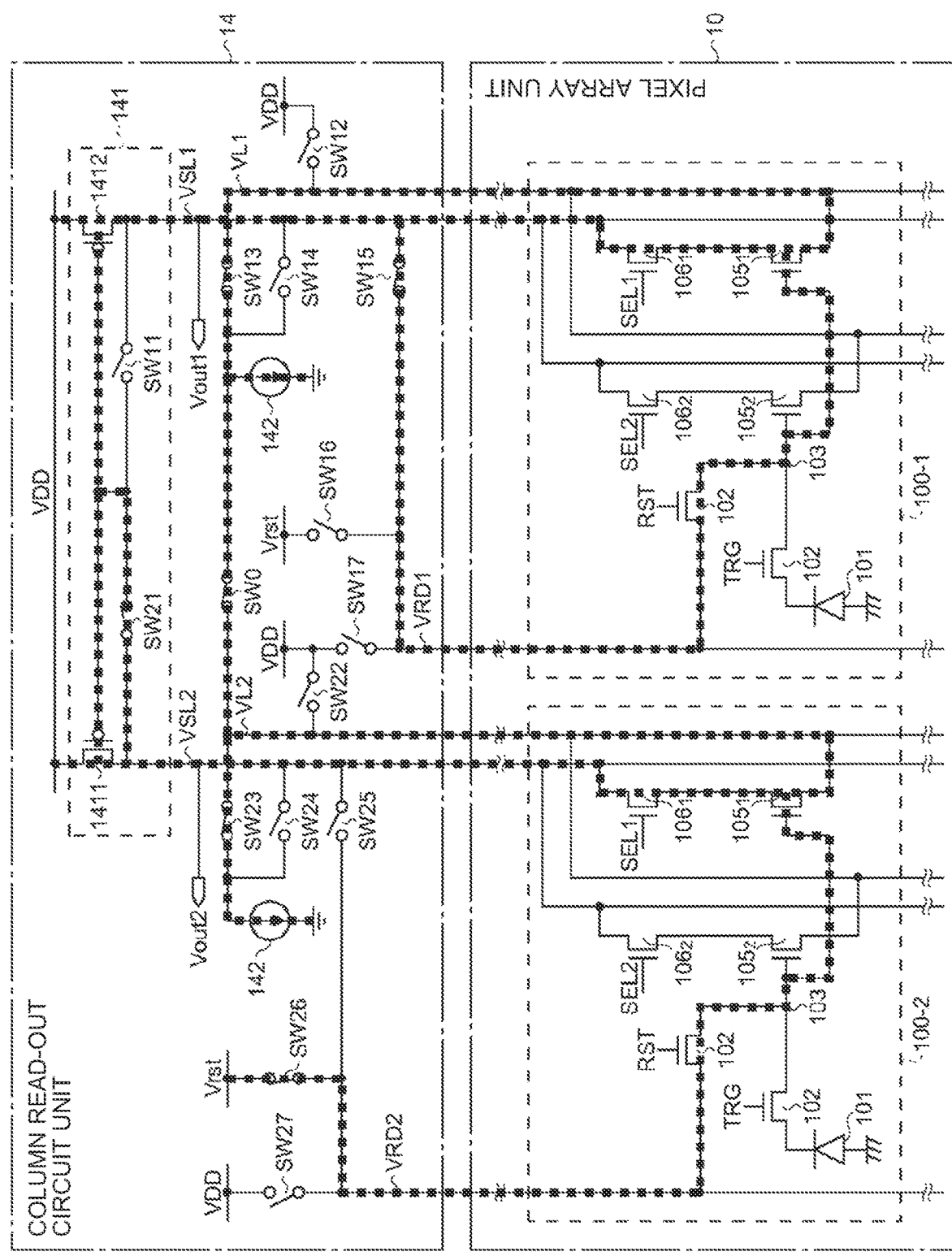
FIG. 14 is a circuit diagram illustrating a third connection state of a circuit configuration example including peripheral circuits according to the first embodiment (part 1).
Figure 15:
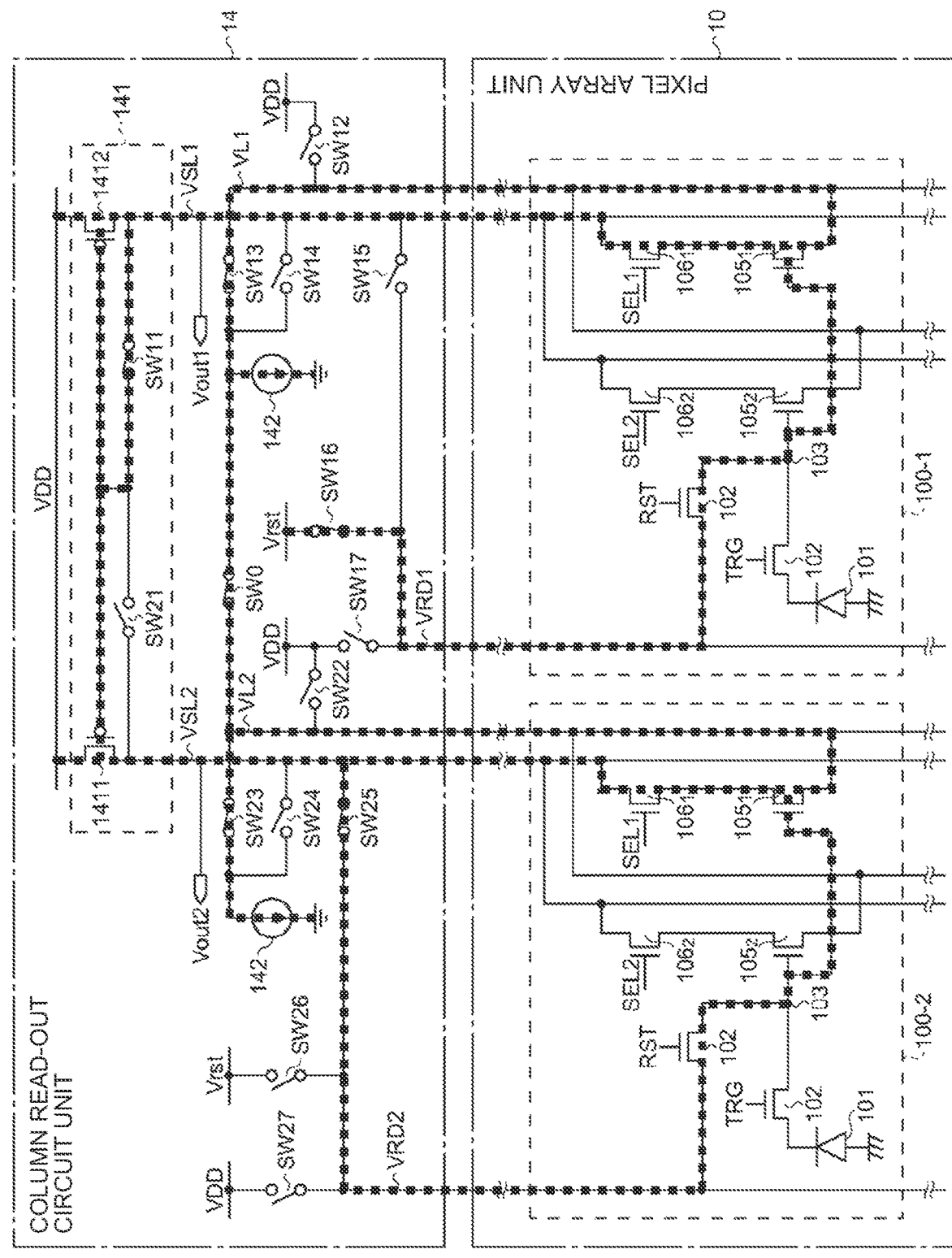
FIG. 15 is a circuit diagram illustrating the third connection state of a circuit configuration example including peripheral circuits according to the first embodiment (part 2).

Subsequently, the following describes a third connection state in a case of implementing the differential amplification read-out circuit in the circuit configuration exemplified in FIG. 11. FIG. 14 and FIG. 15 are circuit diagrams illustrating the third connection state in a case of implementing the differential amplification read-out circuit in the circuit configuration exemplified in FIG. 11. FIG. 14 illustrates a case in which the unit pixel 100-1 is caused to be the signal pixel and the unit pixel 100-2 is caused to be the reference pixel, and FIG. 15 illustrates a case in which the unit pixel 100-2 is caused to be the signal pixel and the unit pixel 100-1 is caused to be the reference pixel. In the third connection state, the differential amplification read-out circuit is configured by using the first amplification transistor $105_1$ of the two amplification transistors ($105_1$ and $105_2$) in each unit pixel 100.

As illustrated in FIG. 14, in the connection state implementing the differential amplification read-out circuit, in a case in which the unit pixel 100-1 is caused to be the signal pixel and the unit pixel 100-2 is caused to be the reference pixel, the switches SW0, SW13, SW15, SW21, SW23, and SW26 are caused to be in the ON state. The other switches are in the OFF state.

By making such a connection state, as represented by a thick dashed line in FIG. 14, the differential amplifier circuit in which the unit pixel 100-1 is caused to be the signal pixel and the unit pixel 100-2 is caused to be the reference pixel is configured, and differential amplification read-out is performed on the unit pixel 100-1.

As illustrated in FIG. 15, in the connection state implementing the differential amplification read-out circuit, in a case in which the unit pixel 100-2 is caused to be the signal pixel and the unit pixel 100-1 is caused to be the reference pixel, the switches SW0, SW11, SW13, SW16, SW23, and SW25 are caused to be in the ON state. The other switches are in the OFF state.

By making such a connection state, as represented by a thick dashed line in FIG. 15, the differential amplifier circuit is configured such that the gate of the first amplification transistor $105_1$ in the unit pixel 100-2/100-1 as the signal pixel is caused to be an inverting input terminal, and the gate of the first amplification transistor $105_1$ in the unit pixel 100-1/100-2 as the reference pixel is caused to be a noninverting input terminal, and differential amplification read-out is performed on the unit pixel 100-2/100-1.

This third connection state is a connection state that causes the conversion efficiency to be the highest, in other words, that causes the dynamic range to be the narrowest, among the four connection states including the first and the second connection states described above and the fourth connection state described later.

2.7.4 Fourth Connection State (Differential Amplification Read-Out Circuit)

Figure 16:
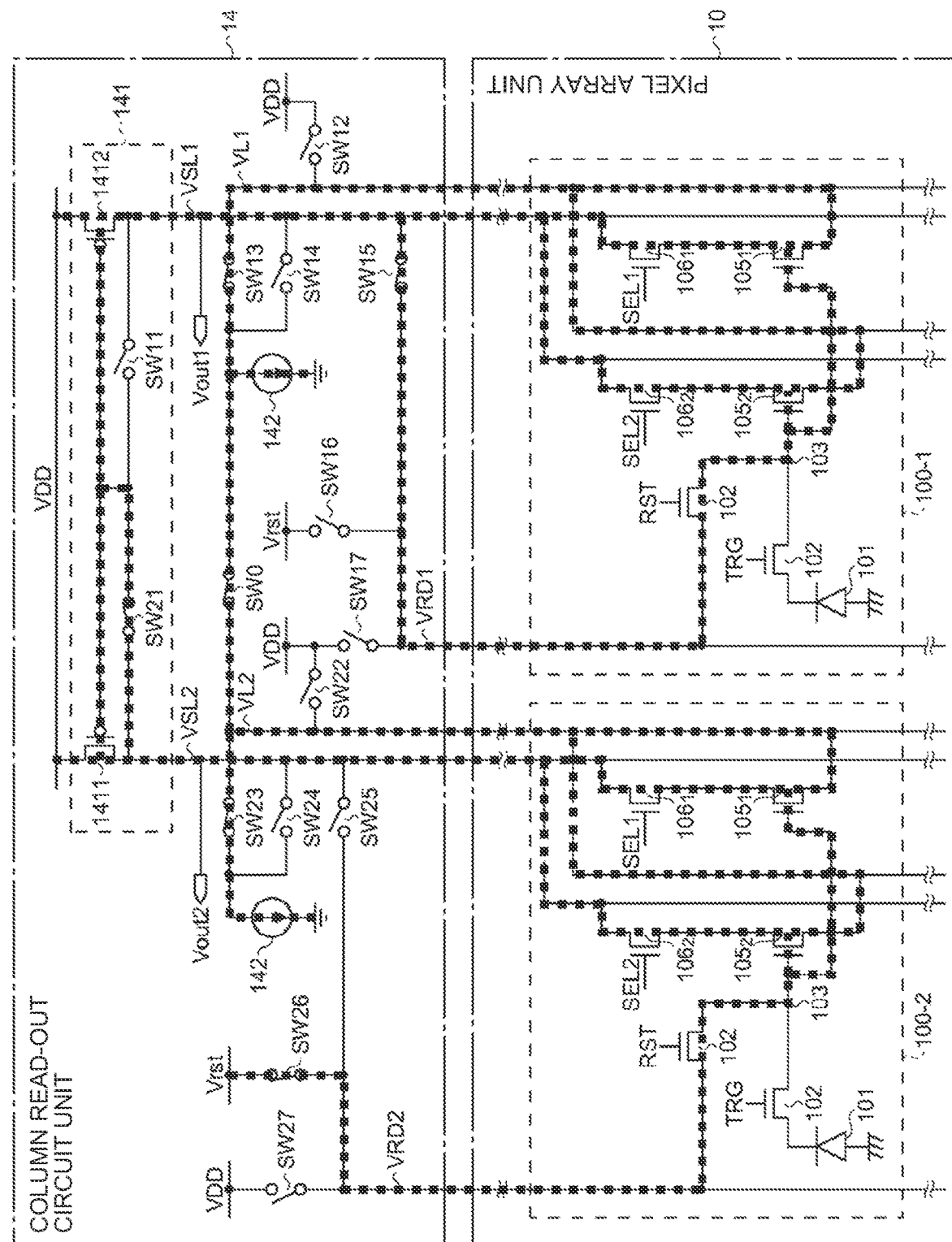
FIG. 16 is a circuit diagram illustrating a fourth connection state of a circuit configuration example including peripheral circuits according to the first embodiment (part 1).
Figure 17:
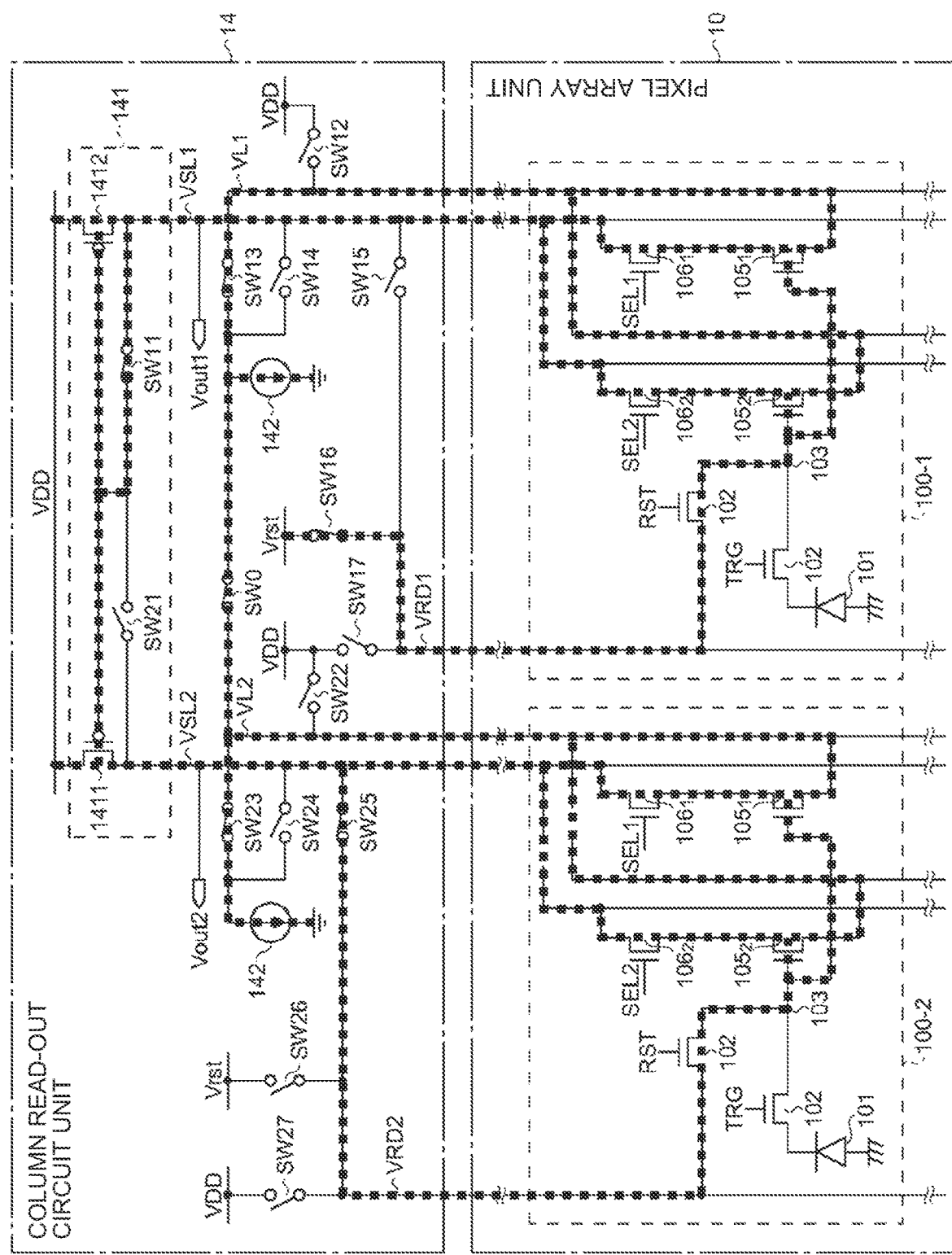
FIG. 17 is a circuit diagram illustrating the fourth connection state of a circuit configuration example including peripheral circuits according to the first embodiment (part 2).

Subsequently, the following describes the fourth connection state in a case of implementing the differential amplification read-out circuit in the circuit configuration exemplified in FIG. 11. FIG. 16 and FIG. 17 are circuit diagrams illustrating the fourth connection state in a case of implementing the differential amplification read-out circuit in the circuit configuration exemplified in FIG. 11. FIG. 16 illustrates a case in which the unit pixel 100-1 is caused to be the signal pixel and the unit pixel 100-2 is caused to be the reference pixel, and FIG. 17 illustrates a case in which the unit pixel 100-2 is caused to be the signal pixel and the unit pixel 100-1 is caused to be the reference pixel. In the fourth connection state, the differential amplification read-out circuit is configured by using both of the two amplification transistors ($105_1$ and $105_2$) in each unit pixel 100.

As illustrated in FIG. 16, in the connection state implementing the differential amplification read-out circuit, in a case in which the unit pixel 100-1 is caused to be the signal pixel and the unit pixel 100-2 is caused to be the reference pixel, the switches SW0, SW13, SW15, SW21, SW23, and SW26 are caused to be in the ON state. The other switches are in the OFF state.

By making such a connection state, as represented by a thick dashed line in FIG. 16, the differential amplifier circuit in which the unit pixel 100-1 is caused to be the signal pixel and the unit pixel 100-2 is caused to be the reference pixel is configured, and differential amplification read-out is performed on the unit pixel 100-1.

As illustrated in FIG. 17, in the connection state implementing the differential amplification read-out circuit, in a case in which the unit pixel 100-2 is caused to be the signal pixel and the unit pixel 100-1 is caused to be the reference pixel, the switches SW0, SW11, SW13, SW16, SW23, and SW25 are caused to be in the ON state. The other switches are in the OFF state.

By making such a connection state, as represented by a thick dashed line in FIG. 17, the differential amplifier circuit is configured such that the gates of the first amplification transistor $105_1$ and the second amplification transistor $105_2$ in the unit pixel 100-2/100-1 as the signal pixel are caused to be inverting input terminals, and the gates of the first amplification transistor $105_1$ and the second amplification transistor $105_2$ in the unit pixel 100-1/100-2 as the reference pixel are caused to be non-inverting input terminals, and differential amplification read-out is performed on the unit pixel 100-2/100-1.

The conversion efficiency of the fourth connection state may be equivalent to conversion efficiency between the conversion efficiency of the second connection state and the conversion efficiency of the third connection state described above, for example, the conversion efficiency of the first connection state described above. Due to this, seamless switching between source follower read-out and differential amplification read-out can be performed.

2.8 Function and Effect

As described above, the unit pixel 100 according to the present embodiment has a configuration in which the gates of the two amplification transistors ($105_1$ and $105_2$) are connected to the FD 103 in parallel. In other words, the unit pixel 100 according to the present embodiment has a two-finger configuration in which the amplification transistor is divided into two parts. Due to this, the overlap capacitance $C_{gd}$ between the FD 103 and the vertical signal line VSL can be increased two times, for example, so that the conversion efficiency $\eta_{vsl}$ can be lowered efficiently.

In the present embodiment, the selection transistors ($106_1$ and $106_2$) corresponding to the two amplification transistors ($105_1$ and $105_2$) on a one-to-one basis are disposed, so that the conversion efficiency $\eta_{vsl}$ can be adjusted depending on a situation and the like. For example, control can be performed not to select one of the first and the second amplification transistors $105_1$ and $105_2$ in a situation in which high conversion efficiency $\eta_{vsl}$ is required, and to select both of the first and the second amplification transistors $105_1$ and $105_2$ in a case of lowering the conversion efficiency $\eta_{vsl}$.

Accordingly, the conversion efficiency at the time of source follower read-out and/or differential amplification read-out can be adjusted, so that, for example, it becomes possible to implement seamless switching between source follower read-out and differential amplification read-out, reduction of random noises, improvement in the PRNU characteristic, and the like.

Additionally, the unit pixel 100 according to the present embodiment has a configuration in which the two amplification transistors ($105_1$ and $105_2$) are connected to the vertical signal line VSL in parallel, so that there is the advantage that increase in power consumption can be suppressed.

3. Second Embodiment

Next, the following describes the solid-state imaging device and the electronic apparatus according to a second embodiment in detail with reference to the drawings.

In the first embodiment, the first amplification transistor $105_1$ and the second amplification transistor $105_2$ are assumed to have equivalent structures, and the first amplification transistor $105_1$ and the second amplification transistor $105_2$ are assumed to have equivalent characteristics, accordingly. On the other hand, to reduce the pixel noise Vn_pix generated by the amplification transistor in the unit pixel 100, it is effective to thin a gate insulating film of the amplification transistor to increase the capacitance $C_{fd}$ of the FD 103. However, in a case of thinning the gate insulating film, a problem is caused such that the amplification transistor tends to be easily broken, and a product service life is shortened.

Thus, the present embodiment describes a configuration that can reduce the pixel noise Vn_pix while preventing the service life from being shortened using examples.

3.1 Layout Example of Unit Pixel

Figure 18:
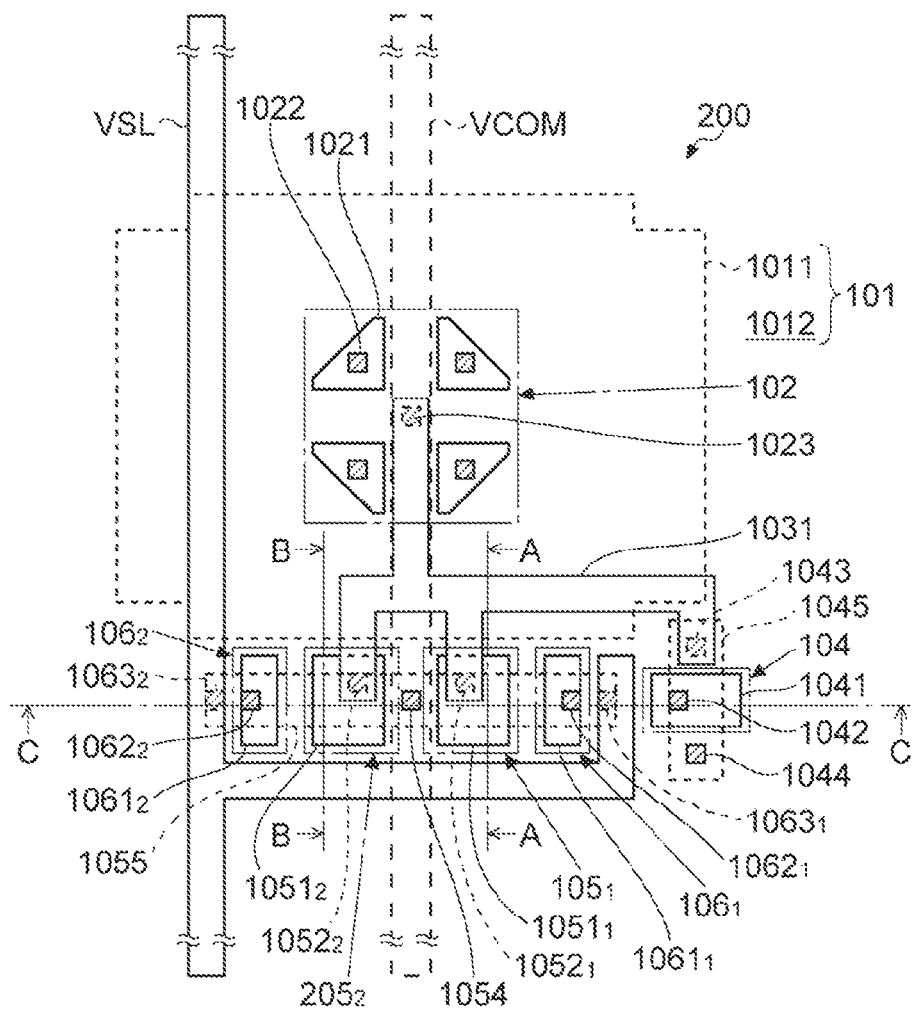
FIG. 18 is an upper view illustrating a layout example of a unit pixel according to a second embodiment.

FIG. 18 is an upper view illustrating a layout example of the unit pixel according to the present embodiment. As illustrated in FIG. 18, a unit pixel 200 according to the present embodiment has the same configuration as that of the unit pixel 100 illustrated in FIG. 7 except that the second amplification transistor $105_2$ is replaced with a second amplification transistor $205_2$.

Figure 19:
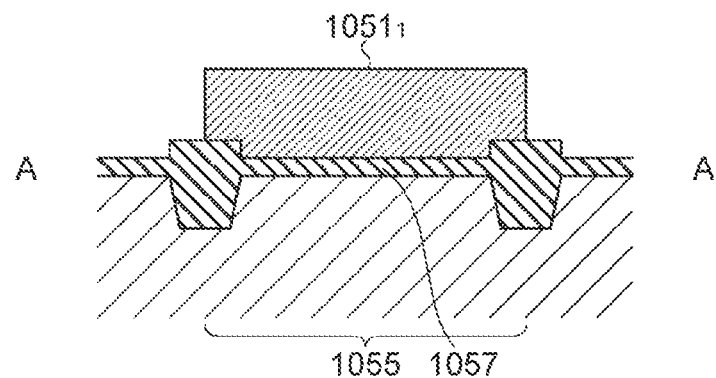
FIG. 19 is a cross-sectional view illustrating a structure example of an A-A cross section in FIG. 18.
Figure 20:
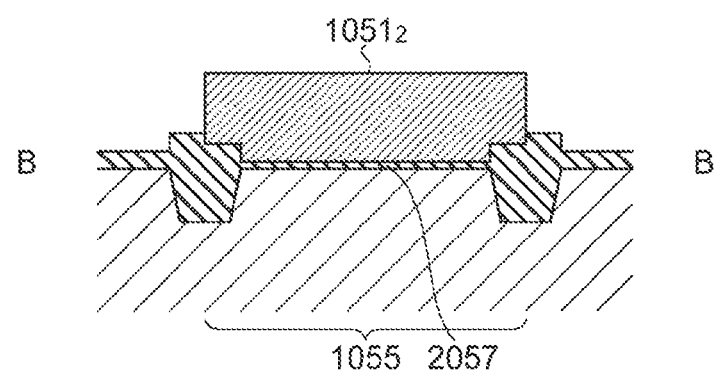
FIG. 20 is a cross-sectional view illustrating a structure example of a B-B cross section in FIG. 18.
Figure 21:
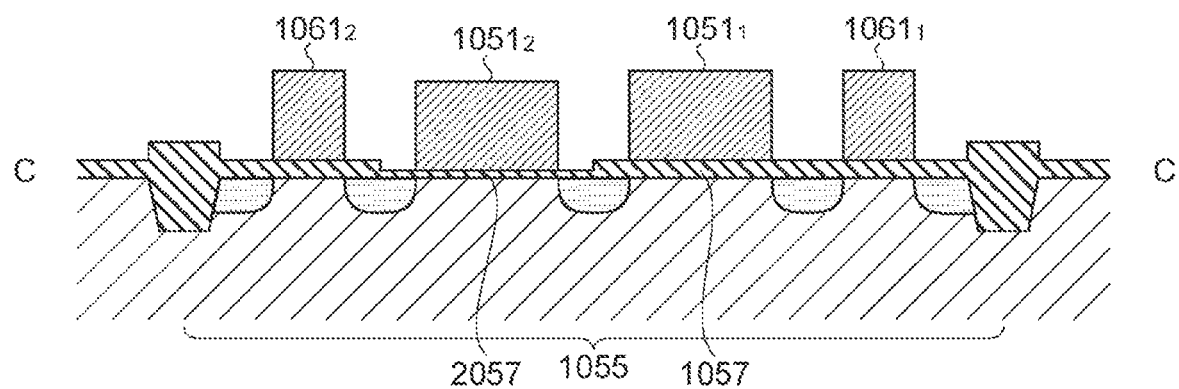
FIG. 21 is a cross-sectional view illustrating a structure example of a C-C cross section in FIG. 18.

FIG. 19 is a cross-sectional view illustrating a structure example of an A-A cross section in FIG. 18, that is, a cross-sectional structure example of the first amplification transistor $105_1$, and FIG. 20 is a cross-sectional view illustrating a structure example of a B-B cross section in FIG. 18, that is, a cross-sectional structure example of a second amplification transistor $205_1$. FIG. 21 is a cross-sectional view illustrating a structure example of a C-C cross section in FIG. 18. However, for simplifying the description, the reset transistor 104 is not illustrated in FIG. 21.

As is clear from FIG. 19 to FIG. 21, in the present embodiment, a gate insulating film 2057 of the second amplification transistor $205_2$ is made thinner as compared with a gate insulating film 1057 of the first amplification transistor $105_1$.

In this way, by making the structure in which the gate insulating film 2057 of the second amplification transistor $205_2$ as one of the two amplification transistors ($105_1$ and $205_2$) is made thinner, the capacitance $C_{fd}$ of the FD 103 is increased, so that the pixel noise Vn_pix at the time of read-out using the second amplification transistor $205_2$ can be reduced. On the other hand, durability of the first amplification transistor $105_1$ is maintained, so that it is possible to prevent the service life of the unit pixel 100, or the CMOS image sensor by extension, from being shortened.

Figure 22:
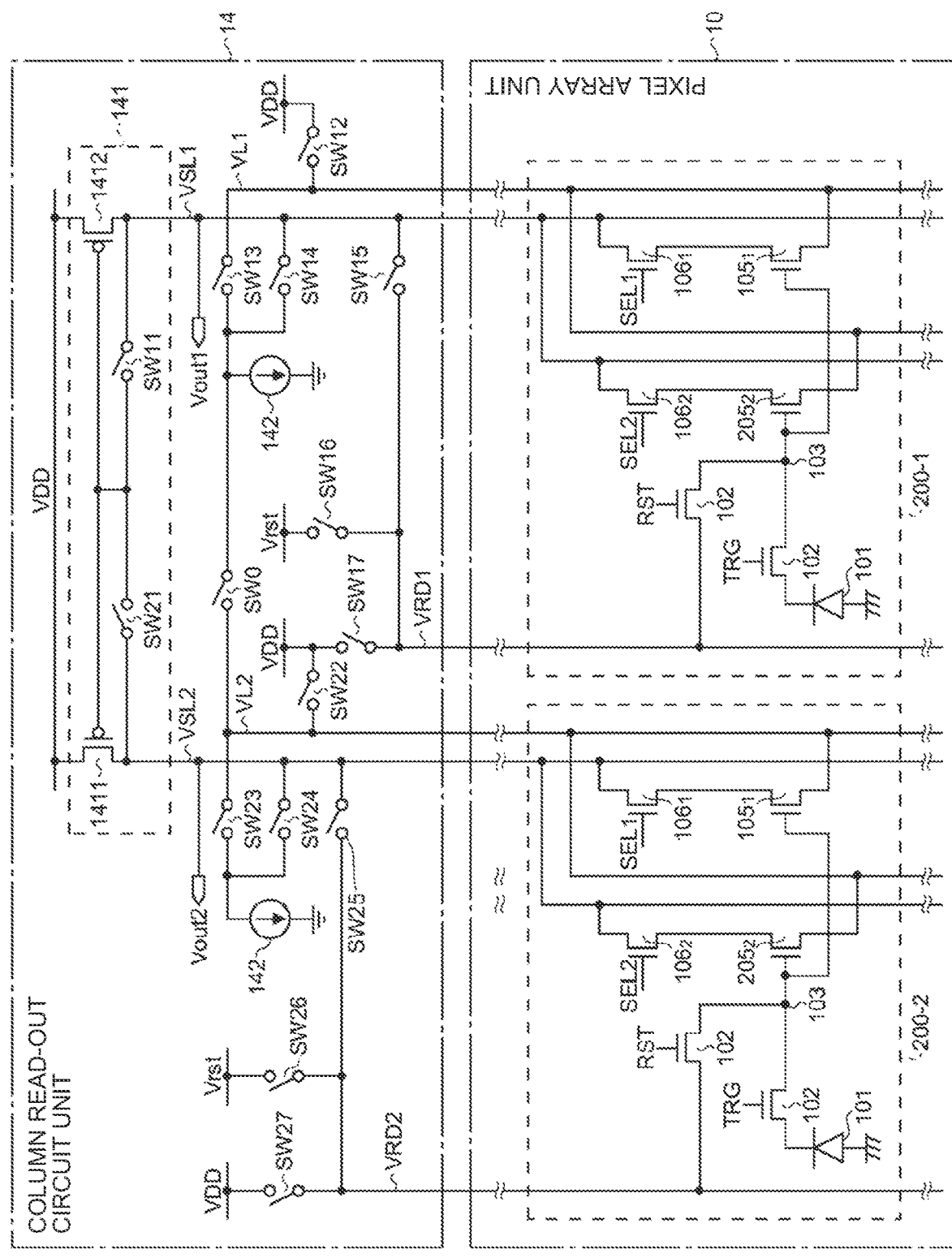
FIG. 22 is a circuit diagram illustrating a circuit configuration example including peripheral circuits enabling switching between source follower read-out and differential amplification read-out according to the second embodiment.

3.2 Switching Between Differential Amplification Read-Out Circuit and Source Follower Read-Out Circuit FIG. 22 is a circuit diagram illustrating a circuit configuration example including peripheral circuits enabling switching between source follower read-out and differential amplification read-out according to the present embodiment. Similarly to FIG. 11, FIG. 22 illustrates an example of a case in which, focusing on two unit pixels 200-1 and 200-2 in the pixel array unit 13, one of the unit pixels 200-1 and 200-2 is caused to be the reference pixel and the other one thereof is caused to be the signal pixel at the time of differential amplification read-out.

As illustrated in FIG. 22, the circuit configuration example according to the present embodiment has the same configuration as that of the circuit configuration example described in the first embodiment with reference to FIG. 11 except that each of the second amplification transistors $105_2$ of the unit pixels 200-1 and 200-2 is replaced with the second amplification transistor $205_2$.

Which one of the first amplification transistor $105_1$ and the second amplification transistor $305_2$ is used in each of the unit pixels 200-1 and 200-2 is controlled by the selection control signals SEL1 and SEL2 similarly to the embodiment described above.

3.3 Function and Effect

As described above, according to the present embodiment, the amplification transistor to be used can be switched depending on a situation such that the first amplification transistor $105_1$ is used in a normal read-out operation, and the second amplification transistor $205_2$ is used in a specific read-out operation such as a super dark situation, for example. Accordingly, a use ratio of the second amplification transistor $205_2$ can be suppressed, so that the product service life can be prevented from being shortened.

The pixel noise Vn_pix is reduced in read-out using the second amplification transistor $205_2$ as compared with read-out using the first amplification transistor $105_1$, so that a higher quality image can be read out.

Additionally, according to the present embodiment, an effect of reducing conversion efficiency and the like can be obtained by thinning the gate insulating film of the second amplification transistor $205_2$ and increasing the capacitance $C_{fd}$ of the FD 103.

Other configurations, operations, and effects including the configuration example of the CMOS image sensor may be the same as those in the embodiment described above, so that detailed description thereof will not be repeated herein.

4. Third Embodiment

Next, the following describes the solid-state imaging device and the electronic apparatus according to a third embodiment in detail with reference to the drawings.

The second embodiment exemplifies a form of reducing the pixel noise Vn_pix by thinning the gate insulating film of the amplification transistor (second amplification transistor $205_2$), which is one of the two amplification transistors (the first amplification transistor $105_1$ and the second amplification transistor $105_2$) in each unit pixel 200, but the form of reducing the pixel noise Vn_pix is not limited to thinning of the gate insulating film. For example, the pixel noise Vn_pix can be reduced by increasing a gate length (also referred to as a channel length) of the amplification transistor to increase the capacitance $C_{fd}$ of the FD 103.

Thus, the present embodiment describes a form of reducing the pixel noise Vn_pix by increasing the gate length (channel length) of one of the two amplification transistors in each unit pixel 300 using examples.

4.1 Layout Example of Unit Pixel

Figure 23:
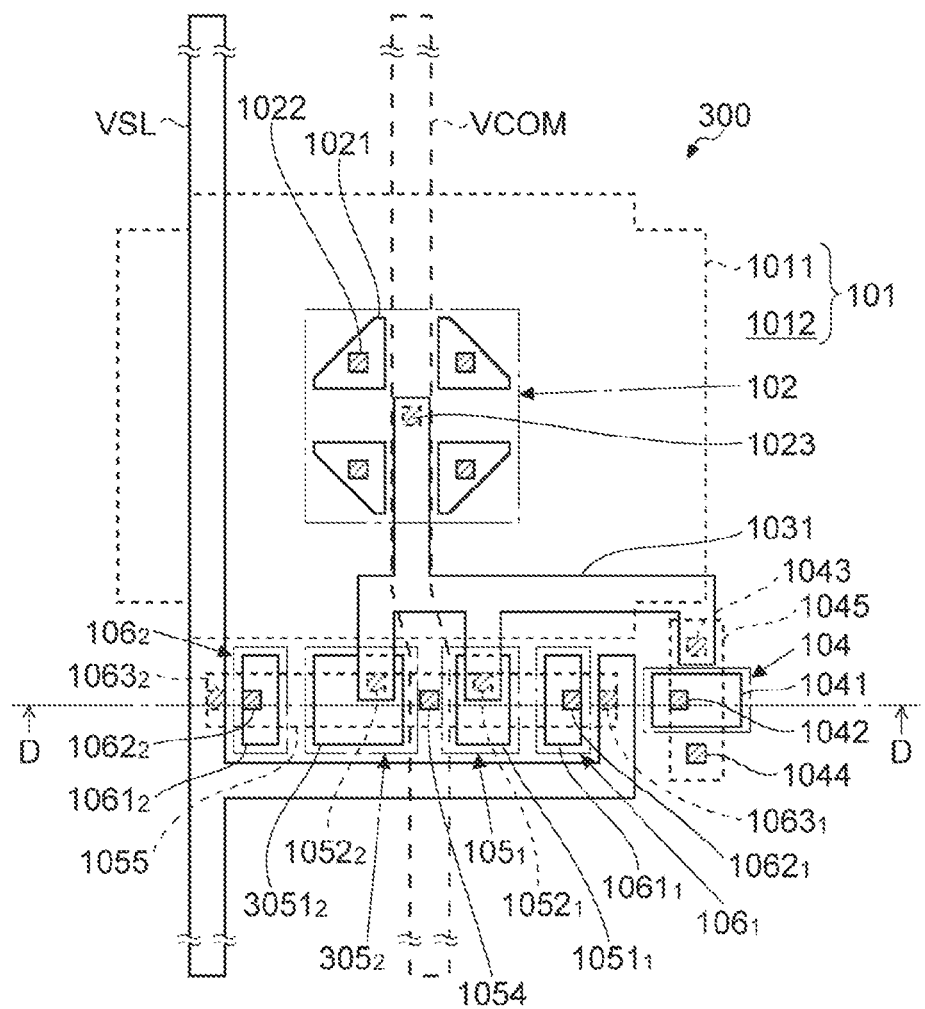
FIG. 23 is an upper view illustrating a layout example of a unit pixel according to a third embodiment.
Figure 24:
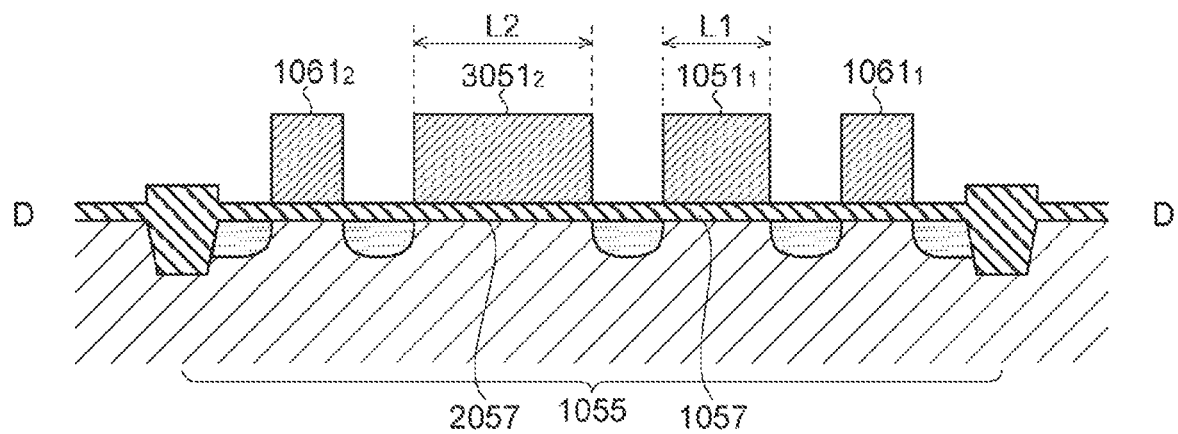
FIG. 24 is a cross-sectional view illustrating a structure example of a D-D cross section in FIG. 23.

FIG. 23 is an upper view illustrating a layout example of the unit pixel according to the present embodiment. FIG. 24 is a cross-sectional view illustrating a structure example of a D-D cross section in FIG. 23, that is, a cross-sectional structure example of a second amplification transistor $305_2$.

As illustrated in FIG. 23, the unit pixel 300 according to the present embodiment has the same configuration as that of the unit pixel 100 illustrated in FIG. 7 or the unit pixel 200 illustrated in FIG. 18 except that the second amplification transistor $105_2$ or $205_2$ is replaced with the second amplification transistor $305_2$. As illustrated in FIG. 24, a gate length (channel length) L2 of the second amplification transistor $305_2$ is longer than a gate length (channel length) L1 of the first amplification transistor $105_1$.

4.2 Function and Effect

As described above, according to the present embodiment, the capacitance $C_{fd}$ of the FD 103 is increased due to the structure in which the gate length (channel length) of the second amplification transistor $305_2$ as one of the two amplification transistors ($105_1$ and $305_2$) is increased, so that the pixel noise Vn_pix can be reduced at the time of read-out using the second amplification transistor $305_2$.

In the third embodiment, thicknesses of gate insulating films of the first and the second amplification transistors $105_1$ and $305_2$ are equivalent to each other. This means that, according to the present embodiment, the pixel noise Vn_pix can be reduced at the time of read-out using the second amplification transistor $305_2$ while maintaining durability of the second amplification transistor $305_2$. However, the embodiment is not limited thereto. The thickness of the gate insulating film of the first and/or the second amplification transistor $105_1$ and/or $305_2$ may be thinned.

According to the present embodiment, effects such as lowering of conversion efficiency and improvement in the PRNU characteristic can also be obtained by increasing the gate length (channel length) of the second amplification transistor $305_2$ to increase the capacitance $C_{fd}$ of the FD 103.

Furthermore, in the present embodiment, the gate length (channel length) L1 of the first amplification transistor $105_1$ may be equivalent to or shorter than the gate length (channel length) of the first amplification transistor $105_1$ according to the first embodiment, for example. In a case of shortening the gate length (channel length) L1 of the first amplification transistor $105_1$, the capacitance $C_{fd}$ of the FD 103 is reduced, so that the conversion efficiency of source follower read-out or differential amplification read-out using the first amplification transistor $105_1$ can be increased.

Other configurations, operations, and effects including the configuration example of the CMOS image sensor, a configuration of switching between source follower read-out and differential amplification read-out, and the like may be the same as those in the embodiments described above, so that detailed description thereof will not be repeated herein.

The embodiments described above exemplify a case in which each of the unit pixels 100/200/300 has the two-finger configuration in which the amplification transistor is divided into two parts, but the number of division of the amplification transistor is not limited to two, and may be three or more. In such a case, a selection transistor corresponding to each finger (divided amplification transistor) on a one-to-one basis is disposed. Due to this, the conversion efficiency at the time of source follower read-out and/or at the time of differential amplification read-out can be more finely adjusted, so that more seamless switching between source follower read-out and differential amplification read-out can be performed, for example.

The embodiments of the present disclosure have been described above, but a technical scope of the present disclosure is not limited to the embodiments described above as it is, and can be variously modified without departing from the gist of the present disclosure. The constituent elements throughout the different embodiments and modifications may be combined with each other as appropriate.

The effects of the respective embodiments described herein are merely examples, and the effects are not limited thereto. Other effects may be exhibited.

The present technique may employ the configurations as described below.

(1)

A solid-state imaging device comprising a plurality of unit pixels, each of the unit pixels comprising:

a photoelectric conversion element configured to generate an electric charge corresponding to an incident light quantity;

a transfer transistor configured to transfer the electric charge generated in the photoelectric conversion element;

a charge accumulation unit configured to accumulate the electric charge transferred by the transfer transistor;

an amplification transistor including at least two fingers that are connected to the charge accumulation unit in parallel; and a selection transistor that is disposed corresponding to each of the fingers of the amplification transistor on a one-to-one basis.

(2)

The solid-state imaging device according to (1), wherein the amplification transistor includes a first amplification transistor corresponding to one of the at least two fingers, and a second amplification transistor corresponding to another of the fingers, and the selection transistor includes a first selection transistor that is connected to the first amplification transistor in series, and a second selection transistor that is connected to the second amplification transistor in series.

(3)

The solid-state imaging device according to (2), further comprising:

first to fourth signal lines, wherein the unit pixels include a first unit pixel and a second unit pixel, in the first unit pixel, a gate of the first amplification transistor and a gate of the second amplification transistor are connected to the charge accumulation unit, a source of the first amplification transistor and a source of the second amplification transistor are connected to the third signal line, a drain of the first amplification transistor is connected to the first signal line via the first selection transistor, and a drain of the second amplification transistor is connected to the first signal line via the second selection transistor, and in the second unit pixel, a gate of the first amplification transistor and a gate of the second amplification transistor are connected to the charge accumulation unit, a source of the first amplification transistor and a source of the second amplification transistor are connected to the fourth signal line, a drain of the first amplification transistor is connected to the second signal line via the first selection transistor, and a drain of the second amplification transistor is connected to the second signal line via the second selection transistor.

(4)

The solid-state imaging device according to (3), further comprising:

a current mirror circuit connected to the first and the second signal lines; and a constant current circuit connected to the third and the fourth signal lines.

(5)

The solid-state imaging device according to (3), further comprising:

a constant current circuit;

a first switch configured to switch connection between the first or the second signal line and the constant current circuit; and a second switch configured to switch connection between the third or the fourth signal line and a predetermined power supply voltage.

(6)

The solid-state imaging device according to (5), further comprising:

a current mirror circuit including a first transistor connected to the first signal line and a second transistor connected to the second signal line;

a third switch configured to switch connection between the third signal line and the constant current circuit;

a fourth switch configured to switch connection between the fourth signal line and the constant current circuit;

a fifth switch configured to switch connection between each of the gates of the first and the second amplification transistors and the first signal line in the first unit pixel;

a sixth switch configured to switch connection between each of the gates of the first and the second amplification transistors and the second signal line in the second unit pixel;

a seventh switch configured to switch connection between each of gates of the first and the second transistors and a drain of the first transistor; and an eighth switch configured to switch connection between each of the gates of the first and the second transistors and a drain of the second transistor.

(7)

The solid-state imaging device according to (6), further comprising:

a control unit configured to switch connection states of the first to the eighth switches, wherein in a case of performing source follower read-out on the unit pixels, the control unit causes the first and the second switches to be in an ON state and causes the third to the eighth switches to be in an OFF state to configure a source follower circuit.

(8)

The solid-state imaging device according to (7), wherein in a case of performing differential amplification read-out to read out a pixel signal from the first unit pixel, the control unit causes the first and the second switches and the eighth switch to be in the OFF state, and causes the third to the seventh switches to be in the ON state to configure a first differential amplifier circuit, and in a case of performing differential amplification read-out to read out a pixel signal from the second unit pixel, the control unit causes the first and the second switches and the seventh switch to be in the OFF state, and causes the third to the sixth switch and the eighth switch to be in the ON state to configure a second differential amplifier circuit.

(9)

The solid-state imaging device according to any one of (3) to (8), wherein the first amplification transistor and the second amplification transistor have a same structure.

(10)

The solid-state imaging device according to any one of (3) to (8), wherein a gate insulating film of the second amplification transistor is thinner than a gate insulating film of the first amplification transistor.

(11)

The solid-state imaging device according to any one of (3) to (8), wherein a gate length of the second amplification transistor is longer than a gate length of the first amplification transistor.

(12)

The solid-state imaging device according to any one of (2) to (11), further comprising:

a drive circuit configured to drive a unit pixel to be read out among the unit pixels, wherein in a case of reading out a pixel signal from the unit pixel to be read out with first conversion efficiency, the drive circuit gives a first selection control signal of High level to a gate of the first selection transistor while maintaining a second selection control signal to be given to a gate of the second selection transistor at Low level, and in a case of reading out a pixel signal from the unit pixel to be read out with second conversion efficiency lower than the first conversion efficiency, the drive circuit gives the first selection control signal of High level to the gate of the first selection transistor, and gives the second selection control signal of High level to the gate of the second selection transistor.

(13)

The solid-state imaging device according to (10) or (11), further comprising:

a drive circuit configured to drive a unit pixel to be read out among the unit pixels, wherein in a case of reading out a pixel signal from the unit pixel to be read out with first conversion efficiency, the drive circuit gives a first selection control signal of High level to a gate of the first selection transistor while maintaining a second selection control signal to be given to a gate of the second selection transistor at Low level, and in a case of reading out a pixel signal from the unit pixel to be read out with second conversion efficiency lower than the first conversion efficiency, the drive circuit maintains the first selection control signal to be given to the gate of the first selection transistor at Low level, and gives the second selection control signal of High level to the gate of the second selection transistor.

(14)

The solid-state imaging device according to any one of (3) to (11), wherein the first amplification transistor and the first selection transistor, and the second amplification transistor and the second selection transistor are laid out in a line symmetric manner about the third or the fourth signal line as a center axis in each of the first and the second unit pixels.

(15)

The solid-state imaging device according to any one of (1) to (10), wherein each of the unit pixels further includes a reset transistor configured to cause an electric charge in the charge accumulation unit to be discharged.

(16)

An electronic apparatus comprising:
a pixel array unit in which a plurality of unit pixels are arranged in a matrix direction;
a drive circuit configured to drive a unit pixel to be read out among the unit pixels;
a read-out circuit configured to read out an analog pixel signal from the unit pixel to be read out that is driven by the drive circuit;
a signal processing circuit configured to convert the pixel signal read out by the read-out circuit into a digital value; and
a control unit configured to control the drive circuit, the read-out circuit, and the signal processing circuit, wherein
each of the unit pixels comprises:
a photoelectric conversion element configured to generate an electric charge corresponding to an incident light quantity;
a transfer transistor configured to transfer the electric charge generated in the photoelectric conversion element;
a charge accumulation unit configured to accumulate the electric charge transferred by the transfer transistor;
an amplification transistor including at least two fingers that are connected to the charge accumulation unit in parallel; and
a selection transistor that is disposed corresponding to each of the fingers of the amplification transistor on a one-to-one basis.

REFERENCE SIGNS LIST

1 CMOS IMAGE SENSOR
11 SYSTEM CONTROL UNIT
12 VERTICAL DRIVE CIRCUIT
13 PIXEL ARRAY UNIT
14 COLUMN READ-OUT CIRCUIT UNIT
15 COLUMN SIGNAL PROCESSING CIRCUIT
16 HORIZONTAL DRIVE CIRCUIT
17 SIGNAL PROCESSING UNIT
100, 100-1, 100-2, 200, 200-1, 200-2, 300 UNIT PIXEL
100A SIGNAL PIXEL
100B REFERENCE PIXEL
101, 101r PD
102, 102r TRANSFER TRANSISTOR
103, 103r FD
104, 104r RESET TRANSISTOR
$105_1$, $105r_1$ FIRST AMPLIFICATION TRANSISTOR
$105_2$, $105r_2$, $205_2$, $305_2$ SECOND AMPLIFICATION TRANSISTOR
$106_1$, $106r_1$ FIRST SELECTION TRANSISTOR
$106_2$, $106r_2$ SECOND SELECTION TRANSISTOR
112 TRANSFER TRANSISTOR DRIVING LINE
114 RESET TRANSISTOR DRIVING LINE
$116_1$ FIRST SELECTION TRANSISTOR DRIVING LINE
$116_2$ SECOND SELECTION TRANSISTOR DRIVING LINE
141 CURRENT MIRROR CIRCUIT
142 TAIL CURRENT SOURCE UNIT
1011 n-TYPE SEMICONDUCTOR REGION
1012 p-TYPE SEMICONDUCTOR REGION
1021, 1041, $1051_1$, $1051_2$, $1061_1$, $1061_2$, $3051_2$ GATE
1022, 1023, 1042, 1043, 1044, $1052_1$, $1052_2$, 1054, $1062_1$, $1062_2$, $1063_1$, $1063_2$ ELECTRODE
1031 WIRING
1045, 1055 ELEMENT FORMATION REGION
1411, 1412 PMOS TRANSISTOR
1057, 2057 GATE INSULATING FILM
LD PIXEL DRIVING LINE
LV VERTICAL PIXEL WIRING
SW0, SW11 to SW17, SW21 to SW27 SWITCH
VCOM VERTICAL CURRENT SUPPLY LINE
VDD POWER SUPPLY VOLTAGE
VL1, VL2 SIGNAL LINE
VRD, VRDr, VRD1, VRD2 VERTICAL RESET INPUT LINE
VSL, VSLr, VSL1, VSL2 VERTICAL SIGNAL LINE
Vest PREDETERMINED VOLTAGE

The invention claimed is:
1. A solid-state imaging device comprising a plurality of unit pixels, each of the unit pixels comprising:
a photoelectric conversion element configured to generate an electric charge corresponding to an incident light quantity;
a transfer transistor configured to transfer the electric charge generated in the photoelectric conversion element;
a charge accumulation unit configured to accumulate the electric charge transferred by the transfer transistor;
an amplification transistor including at least two fingers that are connected to the charge accumulation unit in parallel; and
a selection transistor that is disposed corresponding to each of the fingers of the amplification transistor on a one-to-one basis.
2. The solid-state imaging device according to claim 1, wherein
the amplification transistor includes a first amplification transistor corresponding to one of the at least two fingers, and a second amplification transistor corresponding to another of the fingers, and
the selection transistor includes a first selection transistor that is connected to the first amplification transistor in series, and a second selection transistor that is connected to the second amplification transistor in series.
3. The solid-state imaging device according to claim 2, further comprising:
a first signal line, a second signal line, a third signal line, and a fourth signal line, wherein
the unit pixels include a first unit pixel and a second unit pixel,
in the first unit pixel,
a gate of the first amplification transistor and a gate of the second amplification transistor are connected to the charge accumulation unit,
a source of the first amplification transistor and a source of the second amplification transistor are connected to the third signal line, a drain of the first amplification transistor is connected to the first signal line via the first selection transistor, and a drain of the second amplification transistor is connected to the first signal line via the second selection transistor, and in the second unit pixel, a gate of the first amplification transistor and a gate of the second amplification transistor are connected to the charge accumulation unit, a source of the first amplification transistor and a source of the second amplification transistor are connected to the fourth signal line, a drain of the first amplification transistor is connected to the second signal line via the first selection transistor, and a drain of the second amplification transistor is connected to the second signal line via the second selection transistor.

4. The solid-state imaging device according to claim 3, further comprising:

a current mirror circuit connected to the first signal line and the second signal line; and a constant current circuit connected to the third signal line and the fourth signal line.

5. The solid-state imaging device according to claim 3, further comprising:

a constant current circuit;

a first switch configured to switch connection between the first signal line or the second signal line and the constant current circuit; and a second switch configured to switch connection between the third signal line or the fourth signal line and a predetermined power supply voltage.

6. The solid-state imaging device according to claim 5, further comprising:

a current mirror circuit including a first transistor connected to the first signal line and a second transistor connected to the second signal line;

a third switch configured to switch connection between the third signal line and the constant current circuit;

a fourth switch configured to switch connection between the fourth signal line and the constant current circuit;

a fifth switch configured to switch connection between the gate of each of the first amplification transistor and the second amplification transistor and the first signal line in the first unit pixel;

a sixth switch configured to switch connection between the gate of each of the first amplification transistor and the second amplification transistor and the second signal line in the second unit pixel;

a seventh switch configured to switch connection between a gate of each of the first transistor and the second transistor and a drain of the first transistor; and an eighth switch configured to switch connection between the gate of each of the first transistor and the second transistor and a drain of the second transistor.

7. The solid-state imaging device according to claim 6, further comprising:

a control unit configured to switch connection states of the first switch to the eighth switch, wherein in a case of performing source follower read-out on the unit pixels, the control unit causes the first switch and the second switch to be in an ON state and causes the third switch to the eighth switch to be in an OFF state to configure a source follower circuit.

8. The solid-state imaging device according to claim 7, wherein in a case of performing differential amplification read-out to read out a pixel signal from the first unit pixel, the control unit causes the first switch, the second switch, and the eighth switch to be in the OFF state, and causes the third switch to the seventh switch to be in the ON state to configure a first differential amplifier circuit, and in a case of performing differential amplification read-out to read out a pixel signal from the second unit pixel, the control unit causes the first switch, the second switch, and the seventh switch to be in the OFF state, and causes the third switch to the sixth switch and the eighth switch to be in the ON state to configure a second differential amplifier circuit.

9. The solid-state imaging device according to claim 3, wherein the first amplification transistor and the second amplification transistor have a same structure.

10. The solid-state imaging device according to claim 3, wherein a gate insulating film of the second amplification transistor is thinner than a gate insulating film of the first amplification transistor.

11. The solid-state imaging device according to claim 3, wherein a gate length of the second amplification transistor is longer than a gate length of the first amplification transistor.

12. The solid-state imaging device according to claim 2, further comprising:

a drive circuit configured to drive a unit pixel to be read out among the unit pixels, wherein in a case of reading out a pixel signal from the unit pixel to be read out with first conversion efficiency, the drive circuit gives a first selection control signal of High level to a gate of the first selection transistor while maintaining a second selection control signal to be given to a gate of the second selection transistor at Low level, and in a case of reading out a pixel signal from the unit pixel to be read out with second conversion efficiency lower than the first conversion efficiency, the drive circuit gives the first selection control signal of High level to the gate of the first selection transistor, and gives the second selection control signal of High level to the gate of the second selection transistor.

13. The solid-state imaging device according to claim 10, further comprising:

a drive circuit configured to drive a unit pixel to be read out among the unit pixels, wherein in a case of reading out a pixel signal from the unit pixel to be read out with first conversion efficiency, the drive circuit gives a first selection control signal of High level to a gate of the first selection transistor while maintaining a second selection control signal to be given to a gate of the second selection transistor at Low level, and in a case of reading out a pixel signal from the unit pixel to be read out with second conversion efficiency lower than the first conversion efficiency, the drive circuit maintains the first selection control signal to be given to the gate of the first selection transistor at Low level, and gives the second selection control signal of High level to the gate of the second selection transistor.

14. The solid-state imaging device according to claim 3, wherein the first amplification transistor and the first selection transistor, and the second amplification transistor and the second selection transistor are laid out in a line symmetric manner about the third signal line or the fourth signal line as a center axis in each of the first unit pixel and the second unit pixel.

15. The solid-state imaging device according to claim 1, wherein each of the unit pixels further includes a reset transistor configured to cause an electric charge in the charge accumulation unit to be discharged.

16. An electronic apparatus, comprising:
- a pixel array unit in which a plurality of unit pixels are arranged in a matrix direction;
- a drive circuit configured to drive a unit pixel to be read out among the unit pixels;
- a read-out circuit configured to read out an analog pixel signal from the unit pixel to be read out that is driven by the drive circuit;
- a signal processing circuit configured to convert the analog pixel signal read out by the read-out circuit into a digital value; and
- a control unit configured to control the drive circuit, the read-out circuit, and the signal processing circuit, wherein
each of the unit pixels comprises:
- a photoelectric conversion element configured to generate an electric charge corresponding to an incident light quantity;
- a transfer transistor configured to transfer the electric charge generated in the photoelectric conversion element;
- a charge accumulation unit configured to accumulate the electric charge transferred by the transfer transistor;
- an amplification transistor including at least two fingers that are connected to the charge accumulation unit in parallel; and
- a selection transistor that is disposed corresponding to each of the fingers of the amplification transistor on a one-to-one basis.

* * * * *